US012813308B2

(12) United States Patent
Grujicic et al.

(10) Patent No.: US 12,813,308 B2
(45) Date of Patent: Nov. 24, 2026

(54) PHOTONIC INTEGRATED CIRCUIT PACKAGES AND METHODS OF MANUFACTURING THE SAME

(71) Applicant: Intel Foundry IP LLC, Santa Clara, CA (US)

(72) Inventors: Darko Grujicic, Chandler, AZ (US); Suddhasattwa Nad, Chandler, AZ (US); Srinivas Pietambaram, Chandler, AZ (US); Rengarajan Shanmugam, Tempe, AZ (US); Marcel Wall, Phoenix, AZ (US); Sashi Kandanur, Chandler, AZ (US); Rahul Manepalli, Chandler, AZ (US); Robert May, Chandler, AZ (US)

(73) Assignee: Intel Foundry IP LLC, Santa Clara, CA (US)

( * ) Notice: Subject to any disclaimer, the term of this patent is extended or adjusted under 35 U.S.C. 154(b) by 0 days.

(21) Appl. No.: 18/189,782

(22) Filed: Mar. 24, 2023

(65) Prior Publication Data

US 2024/0321657 A1 Sep. 26, 2024

(51) Int. Cl.
*H10W 70/692* (2026.01)
*G02B 6/42* (2006.01)
(Continued)

(52) U.S. Cl.
CPC ....... *H10W 70/692* (2026.01); *H10W 70/635* (2026.01); *H10W 70/66* (2026.01); *G02B 6/4214* (2013.01)

(58) Field of Classification Search
CPC ............... H01L 23/15; H01L 23/49827; H01L 23/49866; H01L 21/486; H01L 23/5385; G02B 6/4214
See application file for complete search history.

(56) References Cited

U.S. PATENT DOCUMENTS 11,848,273 B2 * 12/2023 Farooq ................ H10W 20/023
12,131,985 B2 * 10/2024 Kanungo ................ C03C 15/00
(Continued)

FOREIGN PATENT DOCUMENTS

JP 2008164943 A 7/2008

OTHER PUBLICATIONS

International Searching Authority, "International Search Report," issued in connection with International Patent Application No. PCT/US2023/085519, mailed on Apr. 22, 2024, 3 pages.
(Continued)

*Primary Examiner* — Tracie Y Green
(74) *Attorney, Agent, or Firm* — Hanley, Flight & Zimmerman, LLC

(57) ABSTRACT

Photonic integrated circuit packages and methods of manufacturing are disclosed. An example integrated circuit package includes: a semiconductor die; a package substrate supporting the semiconductor die, the package substrate including a glass core, the glass core including a through glass via extending between opposing first and second surfaces of the glass core, the glass core including a recess spaced apart from the through glass via, the recess defined by a third surface of the glass core, the recess having a different shape than the through glass via; and a reflective metal disposed on the third surface to define a mirror, the reflective metal also disposed between a wall of the through glass via and a conductive material disposed in the through glass via.

20 Claims, 12 Drawing Sheets

(51) Int. Cl.
*H10W 70/63* (2026.01)
*H10W 70/66* (2026.01)

(56) References Cited

U.S. PATENT DOCUMENTS

| | | | | |
|---|---|---|---|---|
| 2014/0355931 | A1 | 12/2014 | Tummala et al. | |
| 2015/0331206 | A1 | 11/2015 | Dutta | |
| 2016/0238801 | A1 * | 8/2016 | Lee | G02B 6/136 |
| 2016/0306111 | A1 * | 10/2016 | Lambert | G02B 6/4214 |
| 2022/0407205 | A1 | 12/2022 | Kamgaing et al. | |
| 2023/0091050 | A1 | 3/2023 | Zhang | |
| 2023/0395445 | A1 * | 12/2023 | Pietambaram | H05K 1/0306 |

OTHER PUBLICATIONS

International Searching Authority, "Written Opinion of the International Searching Authority," issued in connection with International Patent Application No. PCT/US2023/085519, mailed on Apr. 22, 2024, 4 pages.

* cited by examiner

PHOTONIC INTEGRATED CIRCUIT PACKAGES AND METHODS OF MANUFACTURING THE SAME

FIELD OF THE DISCLOSURE

This disclosure relates generally to integrated circuits and, more particularly, to photonic integrated circuit packages and methods of manufacturing the same.

BACKGROUND

In many integrated circuit packages, one or more semiconductor dies are mechanically and electrically coupled to an underlying package substrate. Some package substrates include glass cores. Such glass cores provide stability for the package and can also be used to propagate light in photonic applications.

Figure 1:
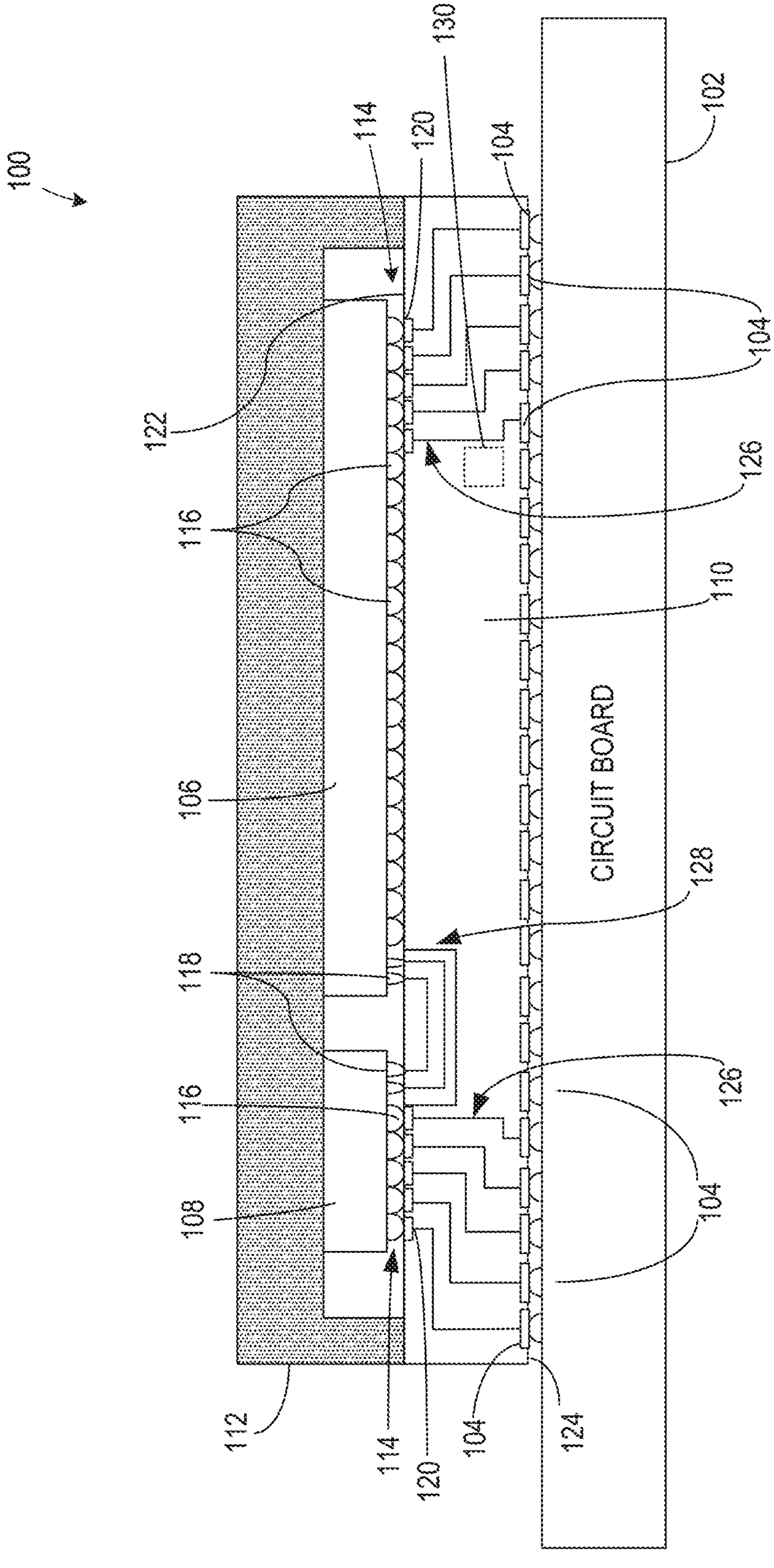
FIG. 1 illustrates an example integrated circuit (IC) package that includes two example semiconductor dies electrically coupled to a package substrate that is electrically coupled to a circuit board.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term “above” describes the relationship of two parts relative to Earth. A first part is above a second part, if the second part has at least one part between Earth and the first part. Likewise, as used herein, a first part is “below” a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing a semiconductor device (e.g., a transistor), a semiconductor die containing a semiconductor device, and/or an integrated circuit (IC) package containing a semiconductor die during fabrication or manufacturing, “above” is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is “above” a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is “above” a second component within the IC package during fabrication when the first component is farther away from a printed circuit board (PCB) to which the IC package is to be mounted or attached. It is to be understood that semiconductor devices are often used in orientation different than their orientation during fabrication. Thus, when referring to a semiconductor device (e.g., a transistor), a semiconductor die containing a semiconductor device, and/or an integrated circuit (IC) package containing a semiconductor die during use, the definition of “above” in the preceding paragraph (i.e., the term “above” describes the relationship of two parts relative to Earth) will likely govern based on the usage context.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in “contact” with another part is defined to mean that there is no intermediate part between the two parts.

Unless specifically stated otherwise, descriptors such as “first,” “second,” “third,” etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time +/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

FIG. 1 illustrates an example integrated circuit (IC) package (e.g., a semiconductor package) 100 constructed in accordance with teachings disclosed herein. In the illustrated example, the IC package 100 is electrically coupled to a circuit board 102 via an array of contact pads or lands 104 on a mounting surface (e.g., a bottom surface) of the package. In some examples, the IC package 100 may include balls, pins, and/or pads, in addition to or instead of the contact pads 104, to enable the electrical coupling of the package 100 to the circuit board 102. In this example, the package 100 includes two semiconductor (e.g., silicon) dies 106, 108 (sometimes also referred to as chips or chiplets) that are mounted to a package substrate 110 and enclosed by a package lid or mold compound 112. While the example IC package 100 of FIG. 1 includes two dies 106, 108, in other examples, the package 100 may have only one die or more than two dies. In some examples, one of the dies 106, 108 (or a separate die) is embedded in the package substrate 110. The dies 106, 108 can provide any suitable type of functionality (e.g., data processing, memory storage, etc.).

In the illustrated example, each of the dies 106, 108 is electrically and mechanically coupled to the substrate 110 via corresponding arrays of interconnects 114. In FIG. 1, the interconnects are shown as bumps. However, the interconnects 114 may be any other type of electrical connection in addition to or instead of the bumps shown (e.g., balls, pins, pads, wire bonding, etc.). The electrical connections between the dies 106, 108 and the substrate 110 (e.g., the interconnects 114) are sometimes referred to as first level interconnects. By contrast, the electrical connections between the IC package 100 and the circuit board 102 (e.g., the pads 104) are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer. Thus, as used herein, first level interconnects refer to interconnects (e.g., balls, bumps, pins, pads, wire bonding, etc.) between a die and a package substrate or a die and an underlying die and/or interposer.

As shown in FIG. 1, the interconnects 114 of the first level interconnects include two different types of bumps, namely, core bumps 116 and bridge bumps 118. As used herein, core bumps are bumps on dies through which electrical signals pass between the dies and other components either within an IC package containing the dies (e.g., a different die) or external to the IC package. Thus, as shown in the illustrated example, when the dies 106, 108 are mounted to the package substrate 110, the core bumps 116 are physically connected and electrically coupled to contact pads 120 on an inner surface 122 of the substrate 110. The contact pads 120 on the inner surface 122 of the package substrate 110 are electrically coupled to the landing pads 104 on the bottom (external) surface 124 of the substrate 110 (e.g., a surface opposite the inner surface 122) via internal interconnects 126 within the substrate 110. As a result, there is a complete signal path between the bumps 116 of the dies 106, 108 and the landing pads 104 mounted to the circuit board 102 that pass through the contact pads 120 and the interconnects 126 provided therebetween.

As used herein, bridge bumps are bumps on the dies through which electrical signals pass between different ones of the dies within an IC package. More particularly, bridge bumps differ from core bumps in that bridge bumps electrically connect two or more different dies via an interconnect bridge (e.g., the interconnect bridge 128 of FIG. 1) embedded in an underlying substrate (e.g., the package substrate 110). As represented in FIG. 1, core bumps 116 are typically larger than bridge bumps 118. In some examples, the interconnect bridge 128 and the associated bridge bumps 118 are omitted.

The example IC package 100 of FIG. 1 is a photonic package that includes at least one optical component 130 integrated with and/or carried by the substrate 110. More particularly, in some examples, the substrate 110 includes a glass substrate, layer, or core 202 (shown in FIG. 2) to which the optical component 130 is coupled. In some examples, light is directed through and/or along the glass core 202 toward the optical component 130.

Figure 2:
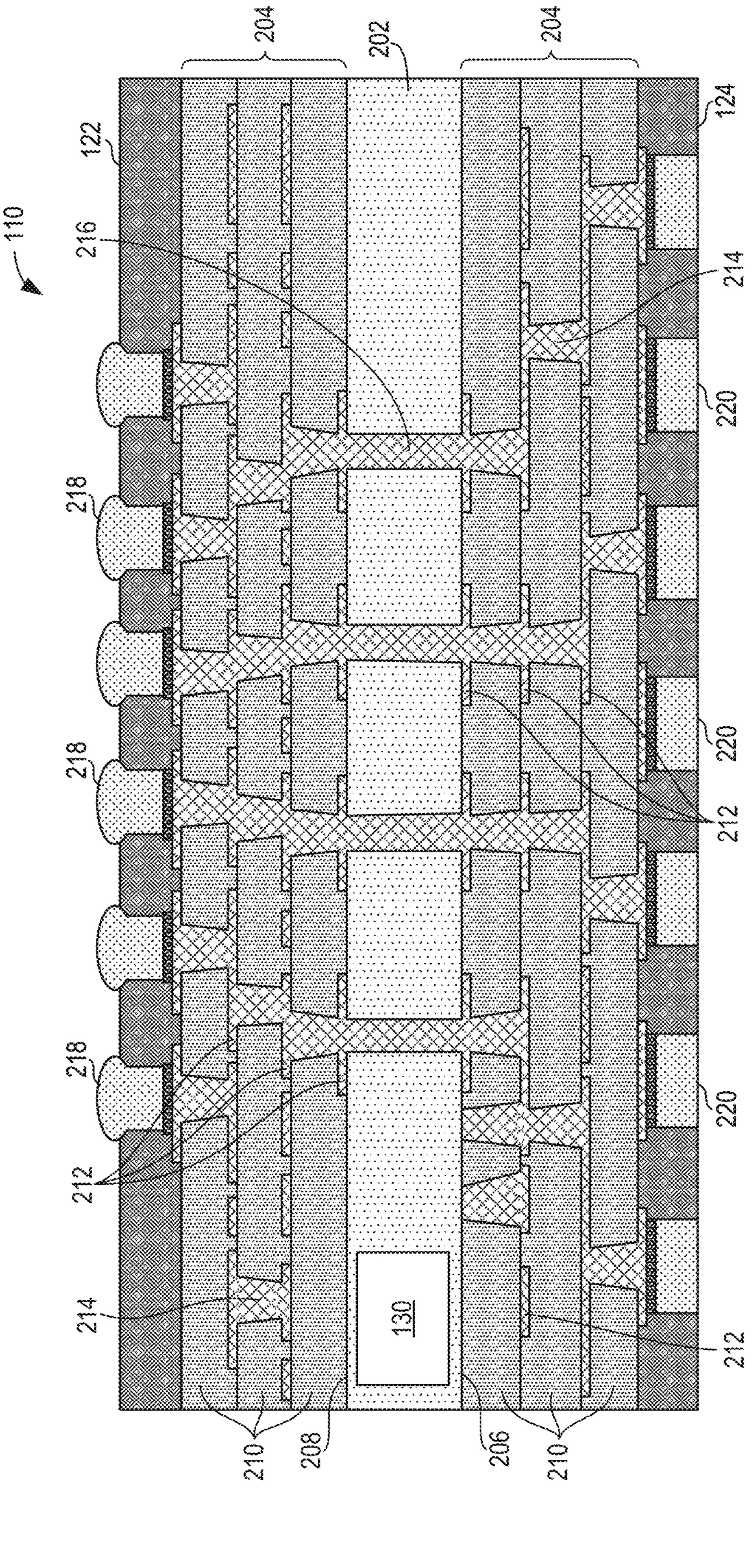
FIG. 2 is a cross-sectional view of an example package substrate that may be implemented in the IC package of FIG. 1.

FIG. 2 is a cross-sectional view providing further detail for an example implementation of the example package substrate 110 of FIG. 1. The package substrate 110 of the illustrated example includes a glass substrate or core 202 between two separate build-up layers or regions 204. In this example, the build-up regions 204 are provided on a first surface 206 of the glass core 202 and a second surface 208 of the glass core 202 opposite the first surface 206. The build-up regions 204 of the illustrated example are defined by an alternating pattern of insulation of dielectric layers 210 and patterned conductive (e.g., metal) layers 212. In this example, there are three dielectric layers 210 and three conductive layers 212 in the build-up regions 204 (not including the outermost layer of conductive material). However, in other examples, any other suitable number of dielectric and conductive layers 210, 212 may be employed. In some examples, the build-up region 204 on at least one side of the glass core 202 may be omitted such that the glass core defines an exterior surface of the package substrate 110.

The conductive layers 212 in the build-up regions 204 are patterned to define electrical routing or conductive traces that serve as signaling or transmission lines to transfer power and/or signals of information between two or more components (e.g., transistors, capacitors, resistors, backend layers, etc. and/or other circuitry) of an associated IC package (e.g., the IC package 100 of FIG. 1). Electrically conductive (e.g., metal) vias 214 extend through the dielectric layers 210 to electrically coupled different ones of the conductive layers 212 in the different build-up regions 204. Further, as shown in FIG. 2, the glass core 202 of the illustrated example includes one or more of through glass vias (TGVs) 216 (e.g., copper plated vias) that extend between the opposite surfaces 206, 208 of the glass core 202 to communicatively and/or electrically couple the conductive layers 212 and associated metal vias 214 within the build-up regions 204 on either side of the glass core 202. Thus, in this example, the electrical routing or traces defined by the patterning of the conductive layers 212, the conductive vias 214, and the TGVs 216 collectively define electrical interconnects (e.g., the interconnects 126 of FIG. 1) through the substrate 110.

In the illustrated example, the package substrate 110 includes a first plurality of connectors 218 (e.g., solder balls, bumps, contact pads, pins, etc.) on the inner surface 122 of the substrate 110 to electrically couple the package substrate 110 to one or more semiconductor dies (e.g., one of the dies 106, 108 of FIG. 1) and/or any other suitable component (e.g., an interposer). Further, the example package substrate 110 includes a second plurality of solder connectors 220 (e.g., solder balls, bumps, contact pads, pins, etc.) to electrically couple the package substrate 110 to a printed circuit board (e.g., the circuit board 102 of FIG. 1), an interposer and/or any other substrate(s).

Although the glass core 202 of the example package substrate 110 is shown as a central core of the substrate 110, in some examples, the glass core 202 can be an interposer and/or any other layer of the package substrate 110. For example, the glass core 202 can be used in place of one or more of the dielectric layers 210 of the package substrate 110. In some examples, the package substrate 110 can include different material(s) including organic materials, silicon, and/or other conventional materials for fabricating package substrates. In some examples, the package substrate 110 includes an embedded multi-die interconnect bridge (EMIB) (e.g., the bridge 128 of FIG. 1).

High density substrate packaging techniques often use organic cores (e.g., an epoxy-based prepreg layer with a glass cloth) as a starting material in next-generation compute applications. These next-generation compute applications have an increased demand in scaling that, along with the proliferation of multichip architectures, specifies (e.g., dictates, requires, etc.) a reduction in warpage and thickness variation. As a result, the starting organic core material has become increasingly thicker in subsequent generation(s) to provide an effective lower coefficient of thermal expansion (CTE). The thicker starting organic core material bridges the gap (e.g., the difference, the delta) to the CTE of the silicon dies (e.g., the dies 106, 108 of FIG. 1) mounted on such substrates. However, increasing core thickness is not a universal solution because some applications have a total core thickness restricted by customer demands (e.g., portable machines, mobile devices, etc.). In addition, the increased core thickness may be detrimental to the electrical performance of the product.

Using glass as a starting core material (e.g., the glass core 202 of FIG. 2) has a mechanical benefit, an electrical benefit, and a design flexibility benefit over using traditional organic core materials (e.g., epoxy-based prepreg). Furthermore, glass cores can be used as waveguides to define optical signal paths capable of transmitting light. As a result, it is possible to incorporate or integrate optical components 130 directly into a package substrate adjacent a surface of the glass core. Frequently, in the fabrication of integrated circuit packages it is necessary to metallize surfaces on the glass core 202. Typically, the process of the metallizing surfaces is done in multiple lithography steps. Due to the decrease in die size, substrate dimension, and package complexity, multiple lithography steps cause an increased likelihood of damage to the integrated circuit packages and increased production time. Examples disclosed herein, include processes of metallizing surfaces of a glass core in fewer lithography steps than other known approaches.

In the illustrated example, of FIG. 2, the optical component 130 is embedded within a cavity in the glass core 202. In other examples, the optical component 130 is on the first surface 206 or second surface 208 of the glass core 202. In some examples, the optical component 130 includes a reflective surface or mirror as further detailed in FIG. 3. Example constructions of the metallized optical components 130 within a substrate containing a glass core are further detailed in FIGS. 3-19.

Figure 3:
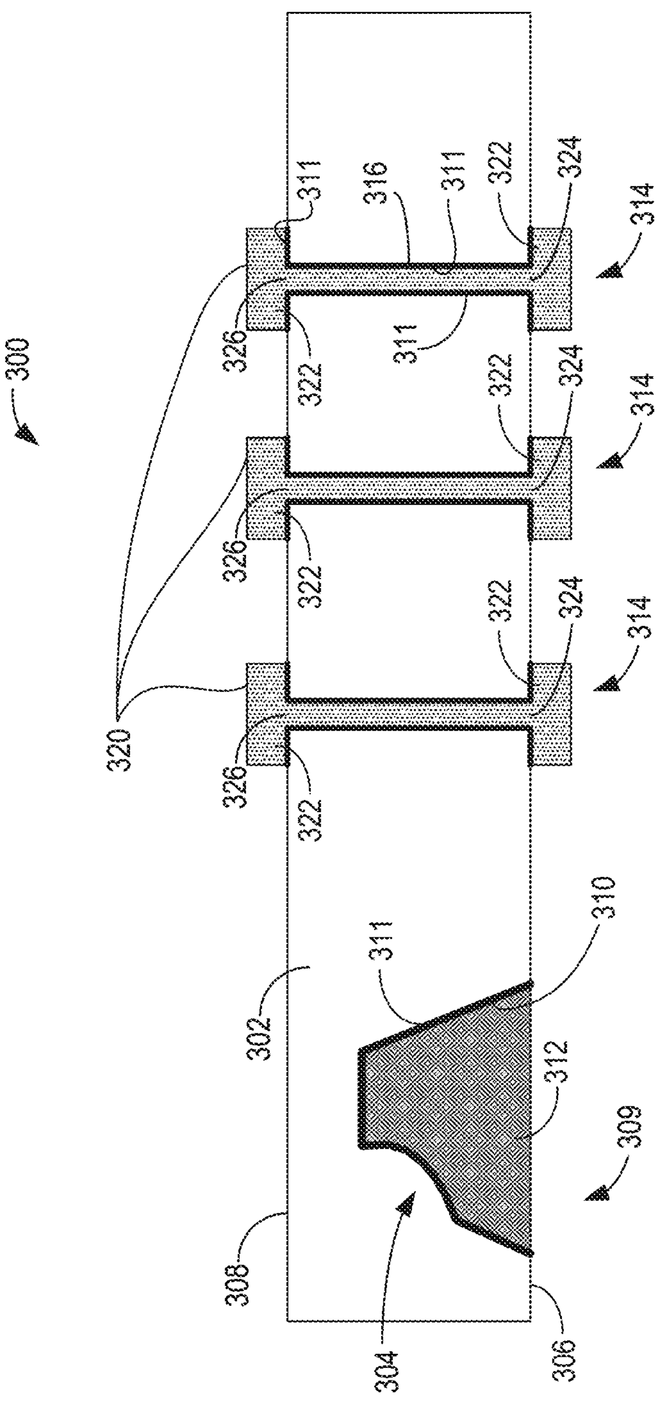
FIG. 3 is a cross-sectional view of an example glass core assembly that may be implemented in the package substrate of FIGS. 1 and/or 2.
Figure 4:
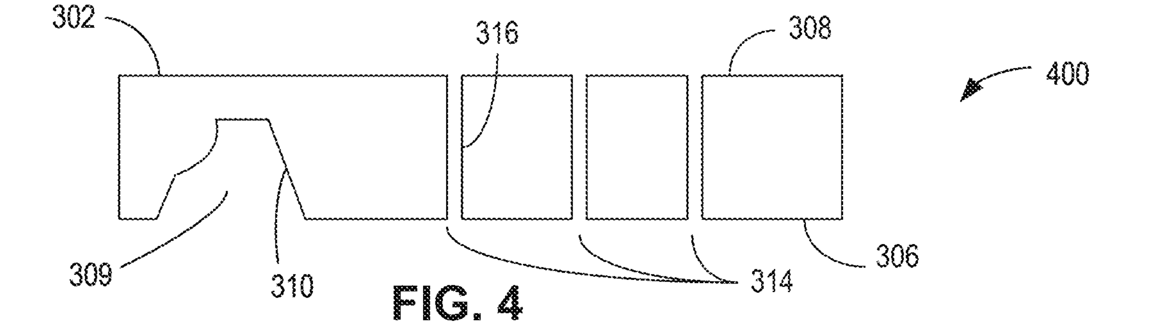
FIGS. 4-8 illustrate different stages in an example process of manufacturing the example glass core assembly of FIG. 3.

FIG. 3 is a cross-sectional view of an example glass core assembly 300 that may be implemented in the package substrate 110 of FIGS. 1 and/or 2. The example glass core assembly 300 of FIG. 3 is an example configuration of the glass core 202 of FIG. 2. The example glass core assembly 300 includes a glass substrate or core 302 (comparable to the glass core 202 of FIG. 2) within which an optical component 304 is embedded. In some examples, the optical component 304 of FIG. 3 corresponds to the optical component 130 of FIGS. 1 and 2. In this example, the optical component 304 corresponds to and/or includes a mirror or light-reflective surface. In some examples, the mirror or light-reflective surface of the optical component 304 includes a non-planar or multi-dimensional surface. In the illustrated example, the optical component 304 is adjacent a first surface 306, opposite a second surface 308, of the example glass core assembly 300. In some examples, the first and second surfaces 306, 308 correspond to the respective first and second surfaces 206, 208 of FIG. 2.

In the illustrated example, the optical component 304 is provided in and/or has a shape defined by a cavity, void, or recess 309 in the glass core 302. In this example, the cavity 309 is positioned along the second surface 306 of the glass core 302 and is defined by a third surface 310 of the glass core 302. In some examples, as shown in FIG. 3, the third surface 310 includes multiple discrete facets that may be angled relative to one another and/or shaped in any suitable matter. In some instances, at least one facet of the third surface 310 is arcuate or curved. In some examples, the mirror or light-reflective surface of the optical component 304 is defined by a reflective metal 311 (also referred to herein as mirror metal) disposed on the third surface 310 of the glass core 302. In some examples, the reflective metal 311 includes at least one of aluminum (Al), gold (Au), silver (Ag), or ruthenium (Ru). In the illustrated example, the optical component 304 includes a fill material 312 to fill the cavity 309. In some examples, the fill material 312 includes at least one of a polymer, copper (Cu), aluminum, gold, silver, or ruthenium (Ru). Although only one optical component 304 is shown in the illustrated example, any suitable number of optical components 304 may be implemented in glass core 302. Further, different ones of the optical components 304 may be different in shape, size, location, and/or functionality.

As shown in FIG. 3, the example glass core 300 assembly includes through glass vias 314. In some examples, the through glass vias 314 of FIG. 3 correspond to the through glass vias 216 of FIG. 2. The through glass vias 314 are defined by holes that extend between the first surface 306 and the opposing second surface 308 and that are filled with a conductive material 320. In some examples, the conductive material 320 includes at least one of copper. In the illustrated example, the example glass core assembly 300 include three through glass vias 314. However, any suitable number of through glass vias 314 may be included. In some examples, the glass core assembly 300 includes a single or two through glass via 314. In other examples, the glass core assembly 300 includes more than three through glass vias 314. In the illustrated example, the through glass vias 314 includes walls 316, 318 between the glass substrate or core 302 and a conductive material 320 disposed in the through glass vias 314. In some examples, the reflective metal 311 is disposed between the walls 316 of the through glass vias 314 and the conductive material 320 disposed in the through glass vias 314. That is, in some examples, the same material used for the mirror or light-reflective surface of the optical component 304 (e.g., the reflective metal 311) is directly against the walls 316 of the holes defining the through glass vias 314. In some instances, the reflective metal 311 thickness or depth disposed on the third surface 310 is approximately equal to the reflective metal 311 disposed on the walls 316. In some examples, the thickness of the reflective metal 311 is consistent between the optical component 304 and the through glass vias 314 because the reflective metal 311 is deposited at both locations simultaneously (e.g., during the same fabrication process). In the illustrated example, the reflective metal 311 is disposed across the entirety of the walls 316 of the through glass vias 314. In other examples, the reflective metal extends a partial length (e.g., less than a full length) of the walls 316, 318 as further detailed in FIGS. 9, 14, and 19.

Further, in this example, the example glass core assembly 300 includes pads 322 on the first surface 306 and the second surface 308 at a first end 324 and a second end 326 of the through glass vias 314. The pads 322 are composed of the same conductive material 320 that extends through the through glass vias 314. In some examples, the reflective metal 311 is disposed between the pads 322 and the first and second surfaces 306, 308 of the glass core 302. In some instances, the reflective metal 311 adjacent the pads 322 is an extension or continuation of (e.g., contiguous with) the reflective metal 311 along the walls 316 of the through glass vias 314. Thus, in some examples, the thickness or depth of the reflective metal 311 disposed adjacent the pads 322 is approximately equal to and/or consistent with the thickness or depth of the reflective metal 311 disposed on the third surface 310 and the walls 316.

In some examples, the reflective metal 311 serves as a seed layer for the conductive material 320 in the through glass vias 314 and the pads 322. Thus, in some examples, the reflective metal 311 is the only material between the glass core 302 and the conductive material 320. In other words, in some examples, the reflective metal 311 is in direct contact with the glass core 302. Similarly, in some examples, the conductive material 320 is in direct contact with the reflective metal 311.

FIGS. 4-8 illustrate different stages of fabrication 400, 500, 600, 700, 800 during an example process of manufacturing the example glass core assembly 300 of FIG. 3. At the stage of fabrication 400 shown in FIG. 4, the glass core 302 is provided with the cavity (e.g., void, recess, etc.) 309 and the through glass vias 314. In some examples, the cavity 309 is defined by the third surface 310, which is non-planar or multi-dimensional. In other words, the cavity 309 is not confined within a single plane of the glass core 302. In some instances, the cavity 309 is arcuate or curved or at least includes a portion that is arcuate or curved. In some examples, the facets or portion of the third surface 310 of the cavity 309 are angled relative to the first surface 306 and the second surface 308. In some examples, the facets or portion of the third surface 310 of the cavity 309 are also angled relative to walls 316 of the through glass vias 314 (which are approximately perpendicular to the first and second surfaces 306, 308). In some examples, the cavity 309 and the through glass vias 314 are provided in the glass core 302 using an etching process and/or a drilling process (e.g., laser drilling).

Figure 5:
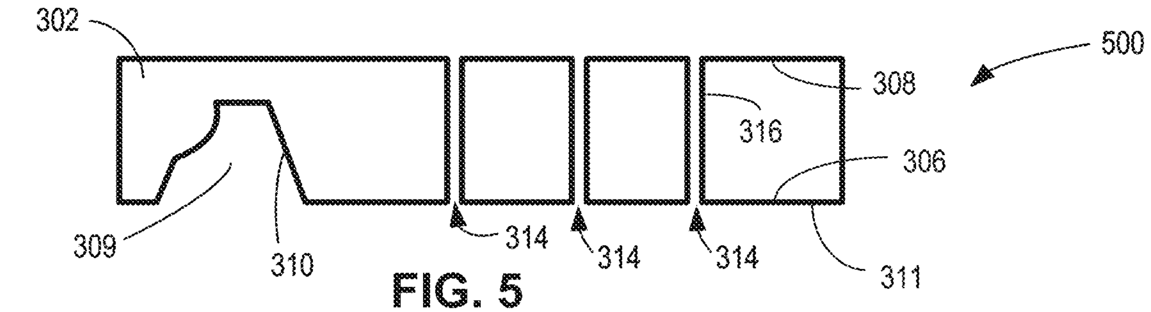

FIG. 5 illustrates the stage of fabrication 500 after metallizing (e.g., coating, disposing, etc.) a thin metal film of the reflective metal 311 on the entirety of (e.g., all exposed surfaces of) the glass core 302. As a result of metallizing the entirety of the glass core 302, the third surface 310 (associated with the cavity 309 used for the optical component 304), the walls 316 of the through glass vias 314, and the first and second surfaces 306, 308 of the glass core 302 all share or are covered by a common reflective metal 311 provided in a single fabrication process. In some examples, the reflective metal 311 is added to all exposed surfaces of the glass core 302 through the use of a non-directional conformal coating process such as atomic layer deposition (ALD). In some examples, chemical vapor deposition (CVD) is used. Both ALD and CVD produce thin films with a relatively consistent thickness across all surfaces such that the reflective metal 311 will have a relatively consistent thickness lining the walls 316 of the through glass vias 314 and lining the third surface 310 defining the cavity 309.

Unlike the single deposition process to add the reflective metal 311 at all locations, as disclosed herein, existing approaches typically use multiple separate fabrication processes to add metal to different regions of the glass core 302. For instance, a first deposition process may be implemented to coat the walls 316 of the through glass vias 314 (to provide a seed layer for subsequent plating of the conductive material 320) and a second, separate deposition process may be implemented to add metal to the third surface 310 in the cavity 309 (to define a mirror or light-reflective surface for the optical component 304). To implement multiple deposition processes in this manner typically requires multiple lithography operations (e.g., seeding, plating, and/or etching) to expose target regions where metal is to be applied during a given deposition process while covering other regions during the given deposition process. In the disclosed example, a common or single deposition is implemented to add the reflective metal 311 at all locations where a thin metal film is needed. Thus, disclosed examples not only reduce the number of deposition processes but also reduce the number of lithography operations needed to produce the example glass core assembly 300 shown in FIG. 3.

Figure 6:
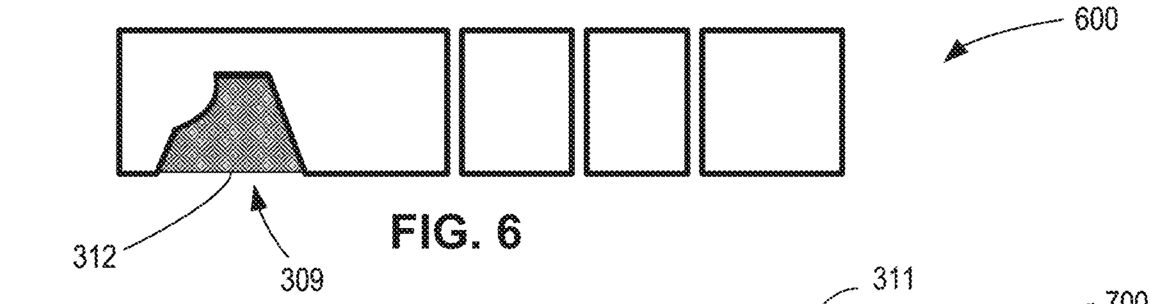
Figure 7:
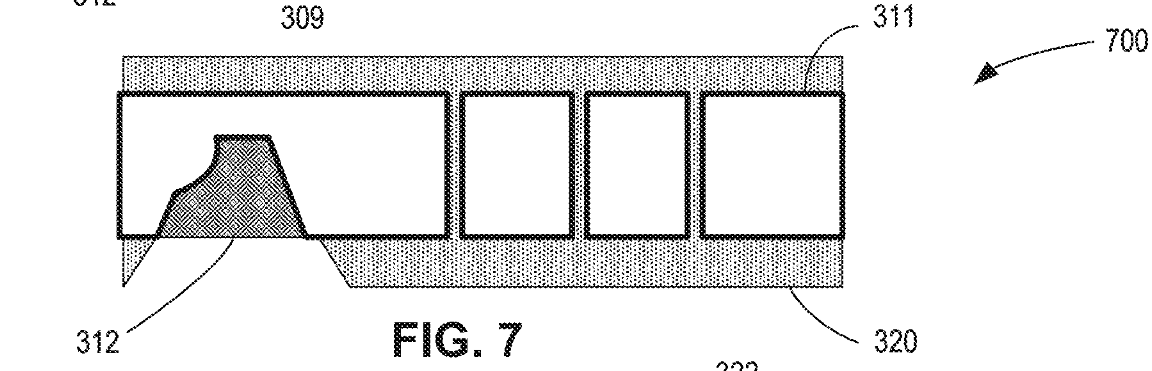
Figure 8:
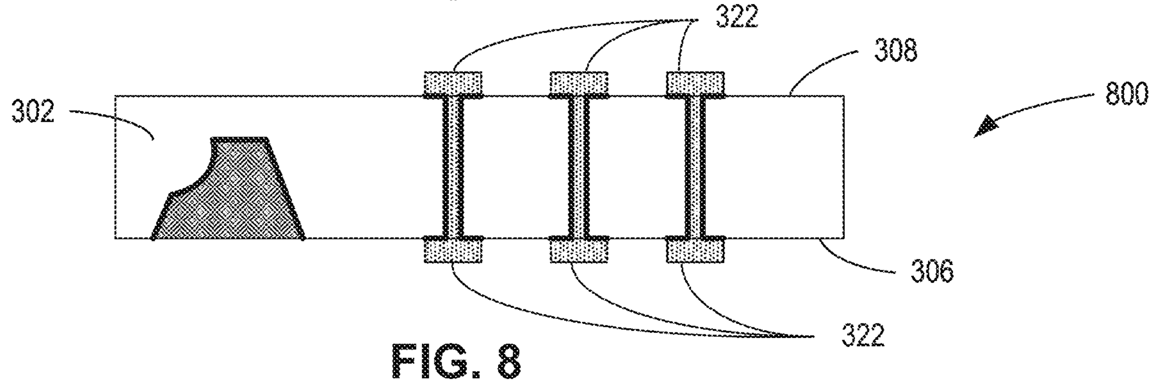

FIG. 6 illustrates the stage of fabrication 600 after deposition of the fill material 312 to fill the cavity 309. In some instances, the fill 312 is used to prevent electrodeposition of the conductive material 320 on the reflective metal 311 during subsequent processing. Specifically, FIG. 7 illustrates the stage of fabrication 700 after the deposition (e.g., plating) of a layer of the conductive material 320 onto the glass core 302. In this example, the reflective metal 311 is used as a seed to facilitate the electroplating process. Thus, as shown in the illustrated example, the conductive material 320 is electroplated to fill the through hole vias 314 and to cover the first and second surfaces 306, 308 of the glass core 302 at the ends of the through glass vias 314 (used as the basis for the subsequently defined pads 320). FIG. 8 illustrates the stage of fabrication 800 after removing excess portions of the conductive material from the glass core 302. In this example, the portions of the conductive material 320 that remain include the through glass vias 314 and the metal pads 322 at the ends of the through glass vias 314 on the first surface 306 and on the second surface 308. In some examples, selective etching (using lithographic processes) and/or planarization is used to remove excess material from the glass core 302.

Figure 9:
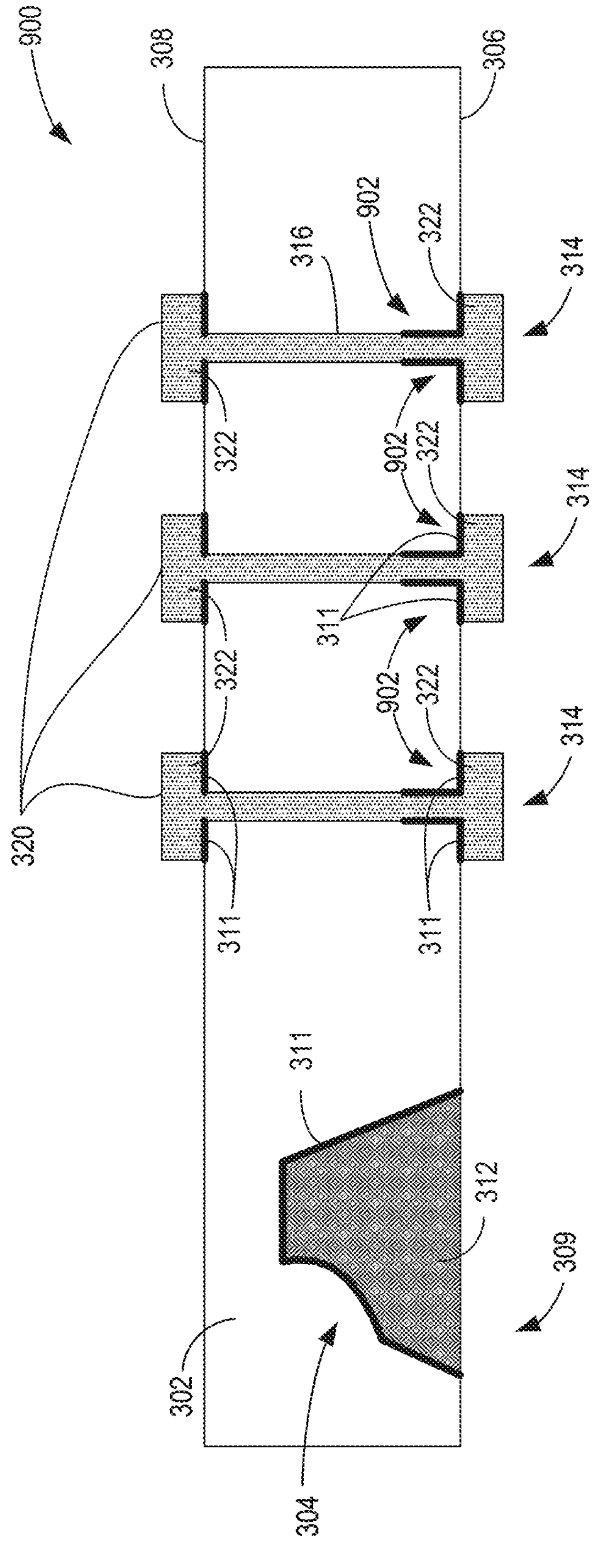
FIG. 9 is a cross-sectional view of another example glass core assembly that may be implemented in the package substrate of FIGS. 1 and/or 2.
Figure 10:
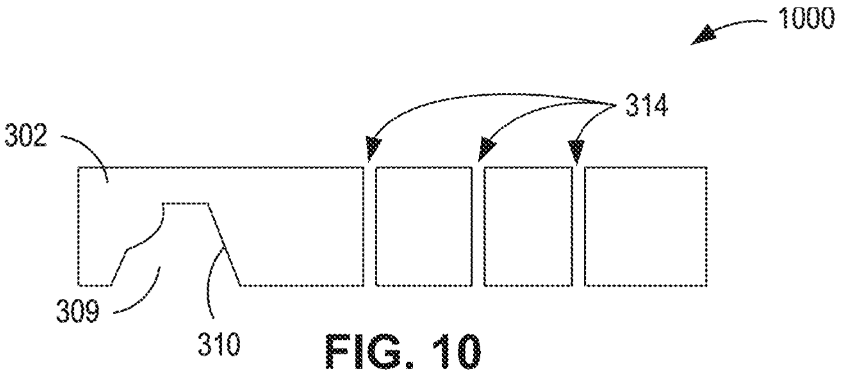
FIGS. 10-14 illustrate different stages in an example process of manufacturing the example glass core assembly of FIG. 9.

FIG. 9 is a cross-sectional view of another example glass core assembly 900 that may be implemented in the package substrate 110 of FIGS. 1 and/or 2. The example glass core assembly 900 of FIG. 9 is an example configuration of the glass core 202 of FIG. 2. For purposes of explanation, components in the example glass core assembly 900 of FIG. 9 that are the same as or similar to components in the example glass core assembly 300 of FIG. 3 are identified by the same reference numbers. Thus, as shown in FIG. 9, the example glass core assembly 900 includes the glass substrate or core 302 within which the optical component 304 is embedded, as described above in FIG. 3. In the illustrated example, the optical component 304 is adjacent the first surface 306, opposite a second surface 308, of the example glass core assembly 900.

In some examples, the mirror or light-reflective surface of the optical component 304 is defined by a reflective metal 311 disposed on the third surface 310 of the glass core 302 (e.g., the surface defining the cavity 309). As described in FIG. 3 and shown again in FIG. 9, the optical component 304 includes a fill material 312 to fill the cavity 309. As previously stated, different ones of the optical components 304 may be different in shape, size, location, and/or functionality. As shown in FIG. 9, the example glass core 900 assembly includes through glass vias 314. In the illustrated example, the example glass core assembly 900 includes three through glass vias 314. However, any suitable number of through glass vias 314 may be included. In some examples, the glass core assembly 900 includes a single or two through glass via 314. In other examples, the glass core assembly 900 includes more than three through glass vias 314. In some examples, the reflective metal 311 is disposed between the walls 316 of the through glass vias 314 and the Conductive material 320 disposed in the through glass vias 314. However, unlike what is shown in FIG. 3, in the illustrated example of FIG. 9, the reflective metal 311 extends only a partial (e.g., less than all) length 902 of the through glass vias 314. In some examples, the partial length 902 extends at least halfway of the through glass via 314. In other examples, the partial length 902 extends less than halfway of the through glass 314, as shown in FIG. 9. Additionally, the example glass core assembly 900 includes pads 322 on a first surface 306 and a second surface 308 at a first end 324 and a second end 326 of the through glass vias 314. Although the full length of the through glass vias 314 are not lined with the reflective metal 311, in this example, both of the pads 322 are still separated from the glass core 302 by a thin layer of the reflective metal 311. In other examples, the pads 322 on at least one of the surfaces 306, 308 of the glass core 302 are in direct contact with the glass core 302. That is, in some examples, there is no reflective metal 311 between ones of the pads 322 and the glass core 302. In some such examples, the pads 322 that are in direct contact with the glass core 302 are the pads 322 positioned at the ends of the through glass vias 314 that are opposite from the partial length 902 of the vias 314 on which the reflective metal 311 is disposed.

FIGS. 10-14 illustrate different stages of fabrication 1000, 1100, 1200, 1300, 1400 during an example process of manufacturing the example glass core assembly 900 of FIG. 9. At the stage of fabrication 1000 shown in FIG. 10, the glass core 302 is provided with the cavity (e.g., void, recess, etc.) 309 and the through glass vias 314.

Figure 11:
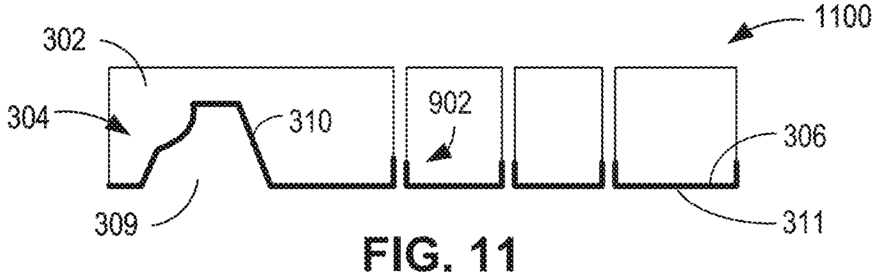

FIG. 11 illustrates the stage of fabrication 1100 after metallizing (e.g., coating, disposing, etc.) a thin metal film of the reflective metal 311 on the glass core 302. Unlike CVD and ALD used to provide the conformal coating of the reflective metal shown in FIG. 5, the thin film metallization shown in FIG. 11 is provided using a directional deposition process. One example deposition process that may be used is physical vapor deposition (PVD). However, any other suitable deposition process may additionally or alternatively be employed. Due to the directional nature of the deposition process, the reflective metal 311 does not coat all surfaces but is deposited onto facing surfaces (e.g., on the side associated with the first surface 306 of the class core 302 in the illustrated example). In some examples, the partial length 902 of the through glass vias 314 coated by the reflective metal 311 corresponds to the distance within the vias 314 that the metal 311 is able to reach during the deposition process. In some instances, the thickness of the reflective metal 311 tapers from the end of through glass vias 314 toward the middle of the through glass vias 314. As a result of the directional deposition process, the first surface 306 of the glass core 302, the third surface 310 (associated with the cavity 309 used for the optical component 304), and the partial length 902 of the through glass vias 314 all share or are covered by a common reflective metal 311 provided in a single fabrication process.

Figure 12:
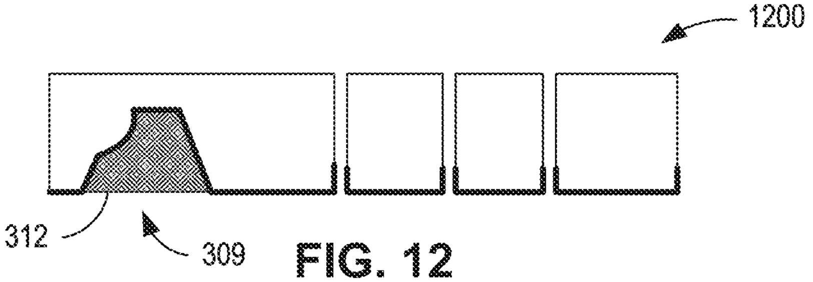
Figure 13:
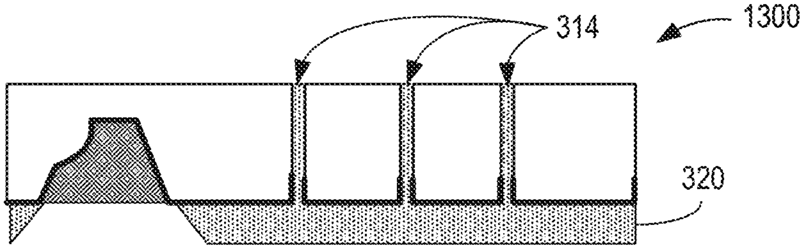
Figure 14:
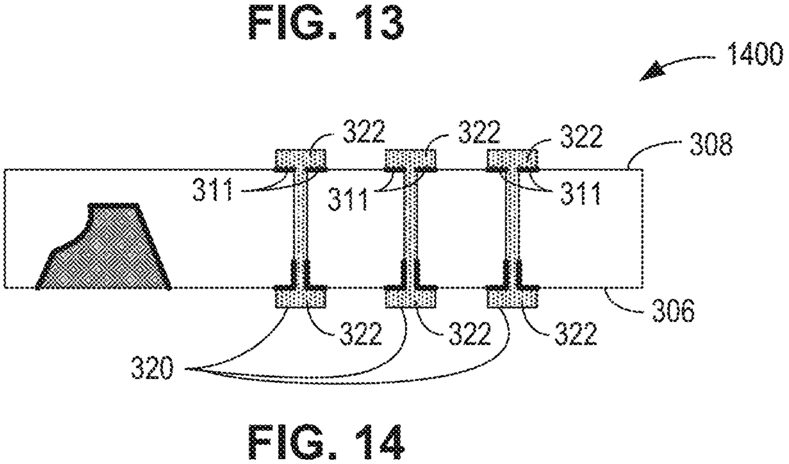

FIG. 12 illustrates the stage of fabrication 1200 after deposition of the fill material 312 to fill the cavity 309. FIG. 13 illustrates the stage of fabrication 1300 after the deposition (e.g., plating) of a layer of the conductive material 320 onto the glass core 302. In some examples, the reflective metal 311 is used as a seed to facilitate the electroplating process. Thus, as shown in the illustrated example, the conductive material 320 is electroplated to fill the through hole vias 314 and to cover the first surface 306 of the glass core 302 at the ends of the through glass vias 314 (used as the basis for the subsequently defined pads 322 shown in FIG. 14). FIG. 14 illustrates the stage of fabrication 1400 after adding additional conductive material 320 on the second surface of the glass core and subsequently removing excess portions of the conductive material 320 from the glass core 302 to define the metal pads 322. In some instances, a separate layer of the reflective metal 311 is deposited (in a separate directional deposition process) on the second surface 308 of the glass core after the stage of fabrication 1300 represented in FIG. 13 and before the stage of fabrication 1400 represented in FIG. 14. In such examples, the separate layer of the reflective metal 311 is used to seed the pads 322 on the second surface 308. In other examples, the pads 322 on the second surface 308 are plated without the reflective metal 311. Inasmuch as the separate layer of the reflective metal 311 is deposited in a separate deposition process, any suitable material may be used in addition to or instead of the reflective metal 311 for this process. For instance, in some examples, titanium (Ti) and/or copper (Cu) is used to seed the pads 322 on the second surface 308. In some examples, selective etching and/or planarization is used to remove excess material from the glass core 302, as shown in FIG. 14.

Figure 15:
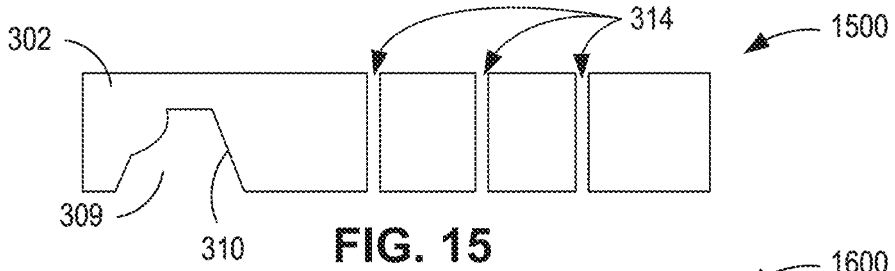
FIGS. 15-19 illustrate different stages in another example process of manufacturing another example glass core assembly.
Figure 16:
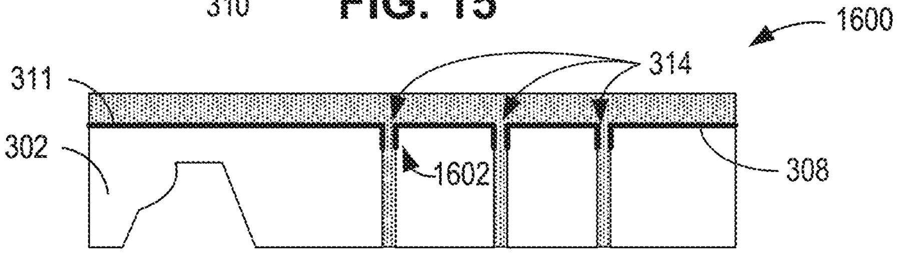
Figure 17:
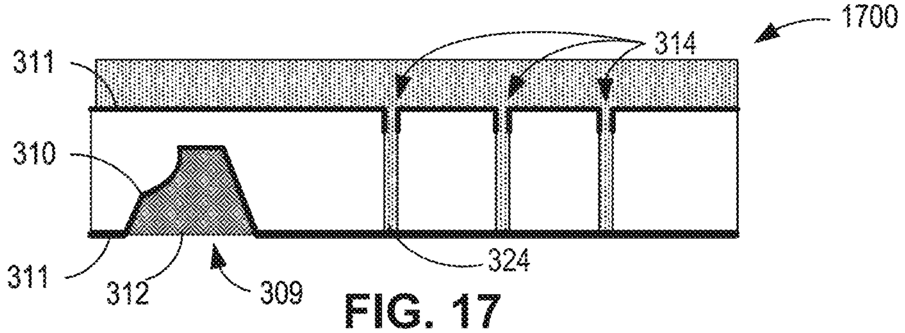
Figure 18:
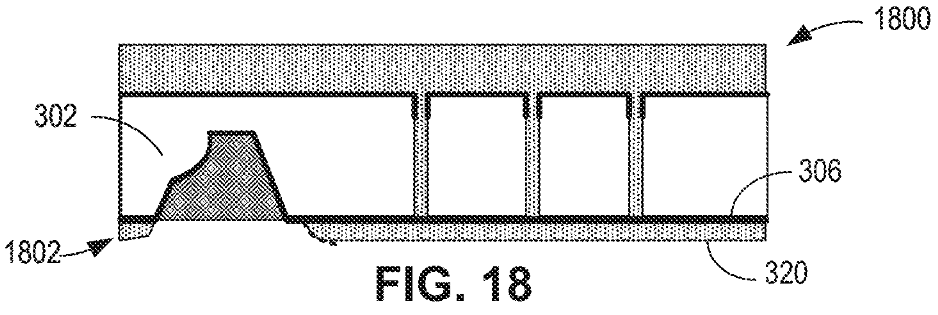
Figure 19:
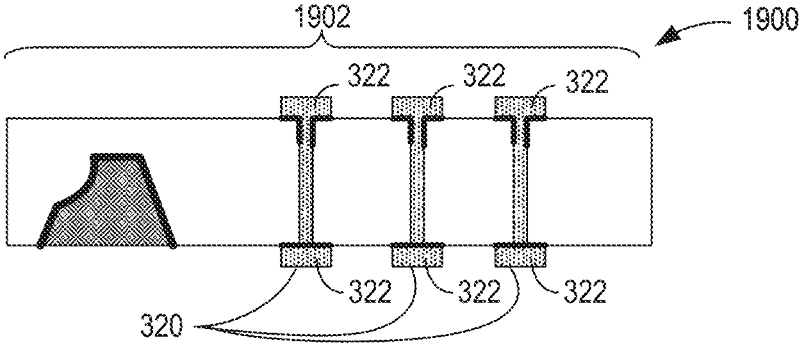

FIGS. 15-19 illustrate different stages of fabrication 1500, 1600, 1700, 1800, 1900 during an example process of manufacturing another example glass core assembly 1902 of FIG. 19. The stage of fabrication 1500 shown in FIG. 15 is identical to the stages of fabrication 400, 1000 shown in FIGS. 4 and 10, respectively. FIG. 16 illustrates the stage of fabrication 1600 after metallizing a thin metal film of the reflective metal 311 on the second surface 308 the glass core 302. In some examples, any suitable metal (whether reflective or not) can be used in addition to or instead of the reflective metal 311 on the second surface 308 because it is not associated with the optical component and, therefore, does not need to be reflective. In this example, a directional deposition technique (e.g., CVD) is employed so that only the second surface 308 is coated. However, at least some of the reflective metal 311 or any other suitable metal will be deposited onto the walls 316 of the through glass vias 314 along a partial length 1602 of the through glass vias 314. Additionally, the stage of fabrication 1600 illustrates the deposition of a layer of the conductive material 320 onto the glass core 302 following the deposition of the reflective metal 311. In this example, the reflective metal 311 is used as a seed layer to facilitate the deposition (e.g., plating) of the conductive material 320. As shown in the illustrated example, the conductive material 320 is electroplated to fill the through hole vias 314 and to cover the second surface 308 of the glass core 302 at the ends of the through glass vias 314 (used as the basis for the subsequently defined pads 322 shown in FIG. 19).

FIG. 17 illustrates the stage of fabrication 1700 after metallizing a second thin metal film of the reflective metal 311 on the first surface 306 the glass core 302. In some examples, this second film of the reflective metal 311 is provided using a second directional deposition (e.g., CVD) process. As a result of this metallizing process, both the first surface 306 of the glass core 302 and the third surface 310 (associated with the cavity 309 used for the optical component 304) share or are covered by a common reflective metal 311 provided in a single fabrication process. In this example, a first end 324 of the through glass vias 314 are covered by the thin metal film of the reflective metal 311. Additionally, the stage of fabrication 1700 represented in FIG. 17 is after deposition of the fill material 312 to fill the cavity 309 following the deposition of the second film of the reflective metal 311.

FIG. 18 illustrates the stage of fabrication 1800 after the deposition of a second layer 1802 of the conductive material 320 onto the glass core 302. As shown in the illustrated example, the conductive material 320 is electroplated to cover the first surface 306 of the glass core 302 using the second thin film of the reflective metal 311 as a seed layer. FIG. 19 illustrates the stage of fabrication 1900 after removing excess portions of the conductive material 320 from the glass core 302 to produce the example glass core assembly 1902. In this example, the portions of the conductive material 320 that remain include the through glass vias 314 and the metal pads 322 at the ends of the through glass vias 314 on the first surface 306 and on the second surface 308. In some examples, selective etching and/or planarization is used to remove excess material from the glass core 302, as shown in FIG. 19.

Figure 20:
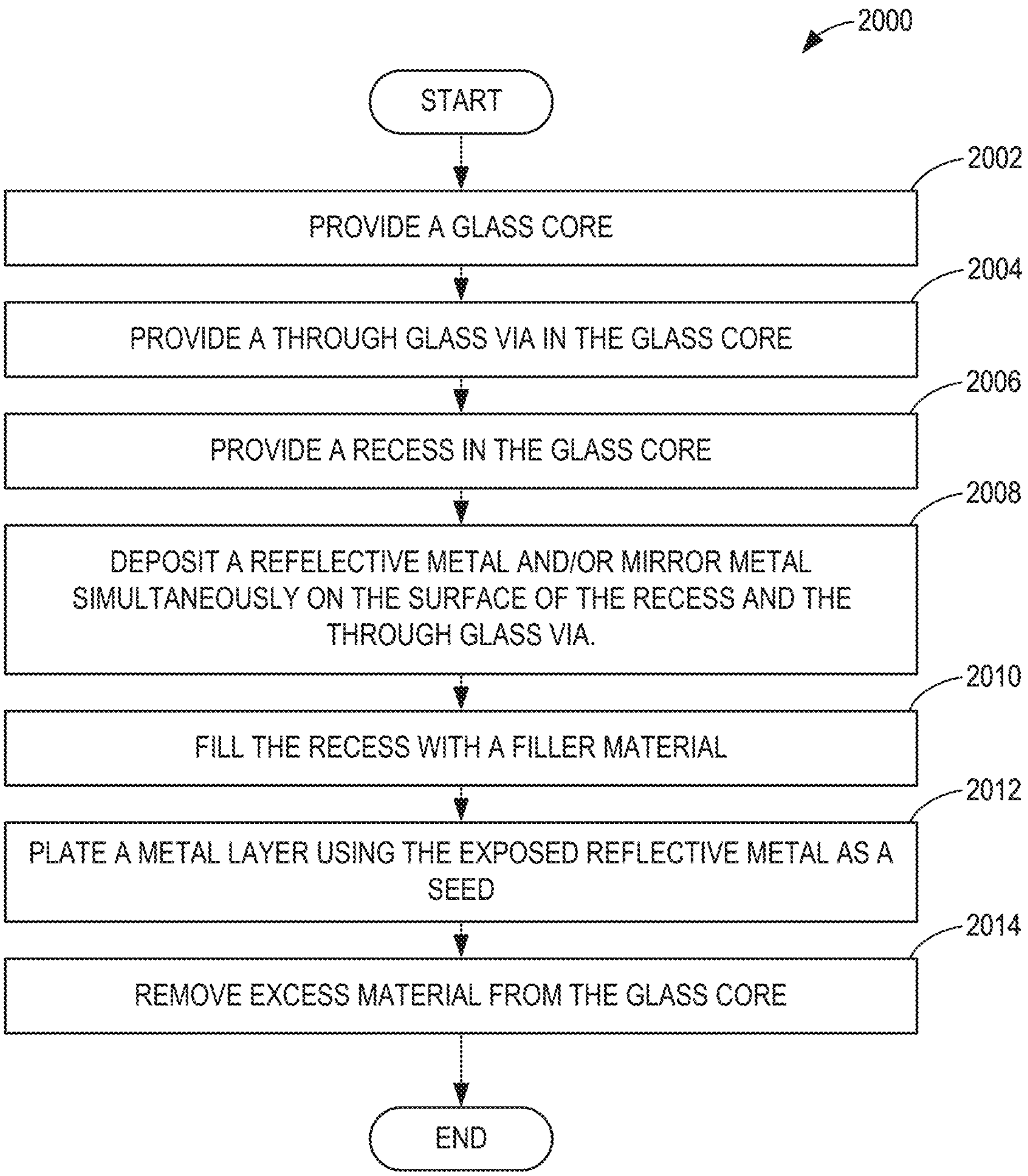
FIG. 20 is a flowchart representative of an example method of manufacturing the example glass core assembly of FIGS. 3 and 9.

FIG. 20 is a flowchart illustrating an example method 2000 of manufacturing a glass core assembly (e.g., the glass core assemblies 300, 900 of FIGS. 3 and 9) with fewer number of deposition processes and fewer number of lithography operations than needed for known manufacturing techniques as described above. Although the example method of manufacture is described with reference to the flowchart illustrated in FIG. 20, many other methods may be alternatively used. For example, the order of execution of the blocks may be changed, and/or some of the blocks may be combined, divided, re-arranged, omitted, eliminated, and/or implemented in any other way.

The example process 2000 of FIG. 20 begins at block 2002, at which a glass core is provided. In some examples, the glass core corresponds to the glass core 302 in FIGS. 3-19. At block 2004, a through glass via is provided in the glass core 302. In some examples, the through glass via corresponds to the through glass vias 314 described above in connection with FIG. 3-19. At block 2006, a recess is provided in the glass core 302. In some examples, the recess corresponds to the cavity 309 described above in FIGS. 3-19. In some examples, the cavity 309 and the through glass vias 314 are provided in the glass core 302 using an etching process and/or a drilling process (e.g., laser drilling). At block 2008, a reflective metal and/or mirror metal (e.g., the reflective metal 311) is simultaneously deposited (e.g., deposited during the same process) on the surface of the recess and on surfaces of the glass core 302 associated with the through glass via 314. In some examples, the surfaces of the glass core 302 covered by the reflective metal 311 depends on the nature of the deposition process used. For instance, if a non-directional deposition technique is used (e.g., PVD, ALD), then all surfaces of the glass core 302 will be coated, including a full length of the through glass vias 314, as represented in FIG. 5. On the other hand, if a directional deposition technique is used (e.g., CVD), only one side of the glass core 302 will be covered with a partial length 902 of the glass vias 314 being covered by the reflective metal 311, as represented in FIG. 11.

At block 2010, the recess is filled with a filler material. In some examples, the filler material corresponds to the filler material 312 described above in FIG. 3. At block 2012, a metal layer is plated using the exposed reflective metal as a seed. In some examples, the metal layer corresponds to the metal layer 320 described in FIG. 3. In some instances, the process at block 2012 results in the stage of fabrication 700 represented in FIG. 7. In other examples, the process at block 2012 results in the stage of fabrication 1300 represented in FIG. 13. In some examples, the plating of the metal layer 320 continues beyond what is shown in FIG. 13 to provide sufficient material to define the metal pads 322. Lastly, at block 2014 the excess material from the glass core 302 is removed. In some examples, the excess material removed at block 2014 corresponds to the metal layer 320 to leave only portions of the conductive material 320 on the surfaces of the glass core 302 corresponding to the metal pads 322 represented by the stages of fabrication 800, 1400 shown in FIGS. 8 and 14, respectively. Thereafter, the example method of FIG. 20 ends and the glass core assembly can be used for further processing.

Figure 21:
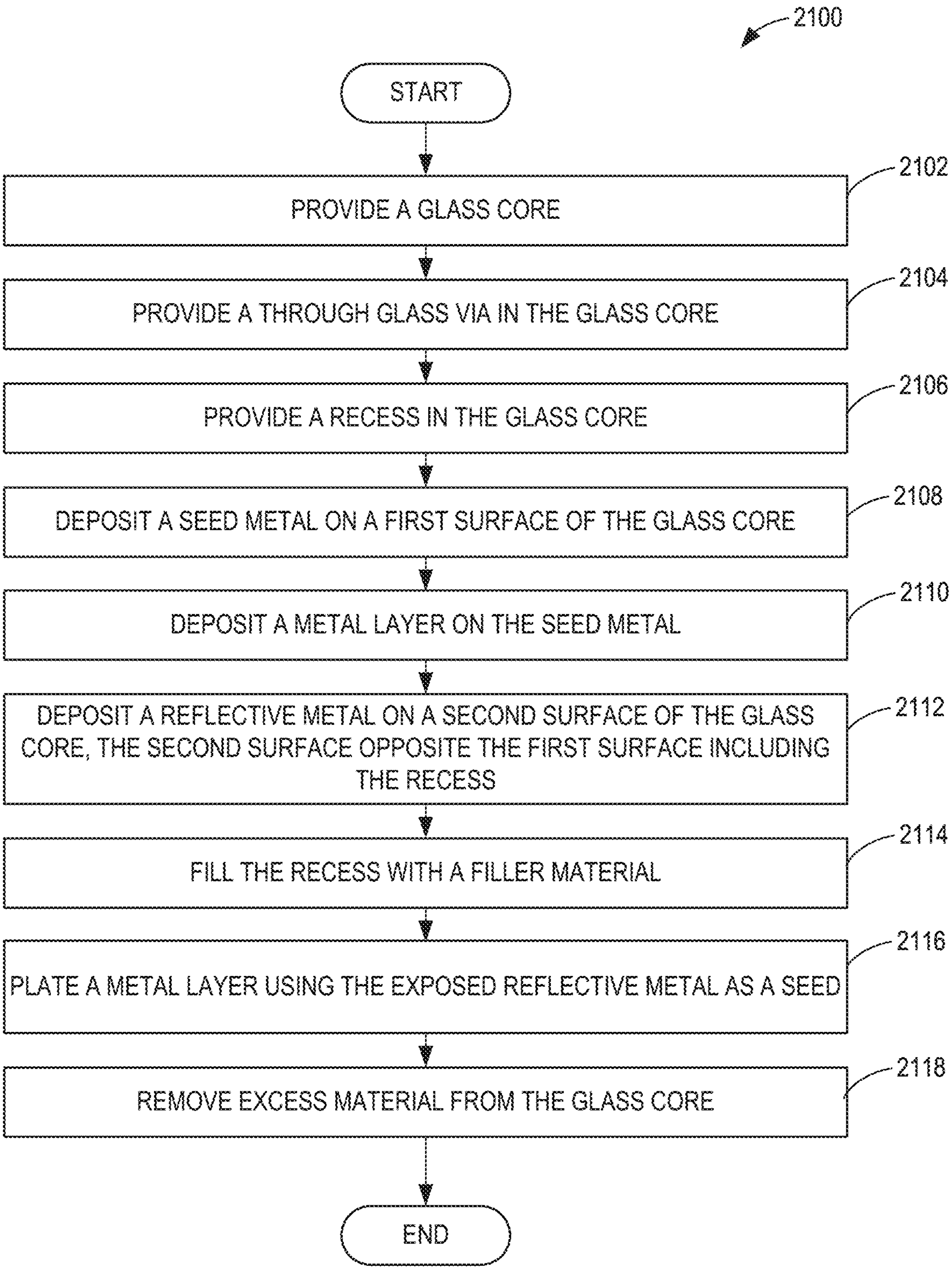
FIG. 21 is a flowchart representative of an example method of manufacturing the example glass core assembly of FIG. 19

FIG. 21 is a flowchart illustrating an example method of manufacturing a glass core assembly (e.g., the glass core assembly 1902 of FIG. 19) with fewer number of deposition processes and fewer number of lithography operations than needed for known manufacturing techniques. Although the example method of manufacture is described with reference to the flowchart illustrated in FIG. 21, many other methods may be alternatively used. For example, the order of execution of the blocks may be changed, and/or some of the blocks may be combined, divided, re-arranged, omitted, eliminated, and/or implemented in any other way.

The example process 2100 of FIG. 21 mirrors the example process 2000 of FIG. 20 for the first three blocks. In other words, blocks 2102, 2104, and 2106 of FIG. 21 correspond to blocks 2002, 2004, and 2006 of FIG. 20. At block 2108, seed metal is deposited on a first surface of the glass core 302. In some examples, the seed metal is the reflective metal 311, In other examples, any other suitable metal may be used. At block 2110 a metal layer is deposited on the seed metal. In some examples, the deposition of the metal layer is continued long enough to enable the metal to fill the through glass vias 314. In some examples, completion of block 2110 corresponds to the stage of fabrication 1600 represented in FIG. 16. In other examples, the plating of the metal layer (e.g., block 2110) is not included until further in the process. At block 2112, a reflective metal 311 is deposited on a second surface of the glass core, the second surface opposite the first surface including the cavity 309. In some examples, the reflective metal 311 extends across or covers exposed portions of the metal layer (e.g., the conductive material 320) at the ends of the through glass vias 314 adjacent the second surface of the glass core 302. In some examples, completion of block 2112 corresponds to the stage of fabrication 1700 represented in FIG. 17. The example process 2100 of FIG. 21 mirrors the example process 2000 of FIG. 20 for the last three blocks. Stated differently, blocks 2114, 2116, and 2118 of FIG. 21 correspond to blocks 2010, 2012, and 2014 of FIG. 20. However, in FIG. 21, the plating of the metal (block 2116) may only occur on the second surface of the glass core because metal was already deposited on the reflective metal 311 on the first surface at block 2110 as described above. After completion of block 2118, the example method of FIG. 21 ends and the glass core assembly can be used for further processing.

The example glass core assemblies 300, 900, 1902 disclosed herein may be included in any suitable electronic component. FIGS. 22-25 illustrate various examples of apparatus that may include, be included in, or otherwise coupled to the glass core assemblies 300, 900, 1902 disclosed herein.

Figure 22:
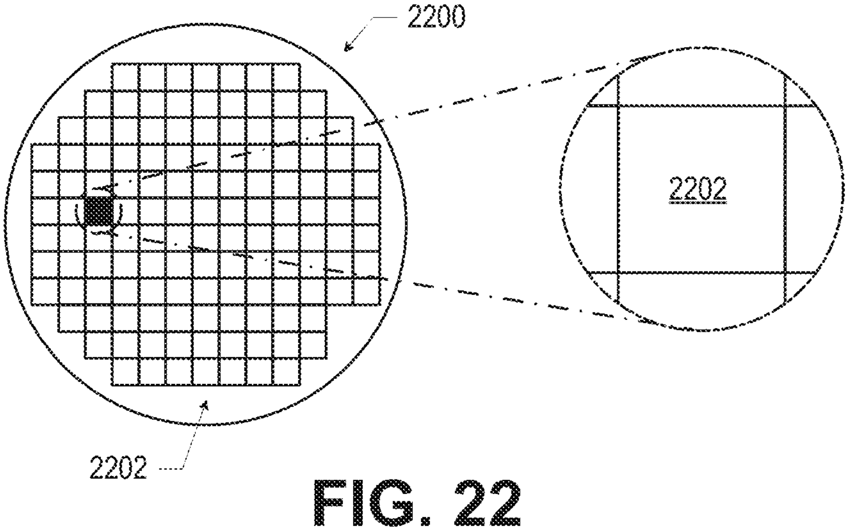
FIG. 22 is a top view of a wafer including dies that may be included in an IC package constructed in accordance with teachings disclosed herein.

FIG. 22 is a top view of a wafer 2200 and dies 2202 that may be included in the IC package 100 of FIG. 1 (e.g., as any suitable ones of the dies 106, 108) that contains any one of the example glass core assemblies 300, 900, 1902. The wafer 2200 may be composed of semiconductor material and may include one or more dies 2202 having circuitry. Each of the dies 2202 may be a repeating unit of a semiconductor product. After the fabrication of the semiconductor product is complete, the wafer 2200 may undergo a singulation process in which the dies 2202 are separated from one another to provide discrete "chips." The die 2202 may include one or more transistors (e.g., some of the transistors 2340 of FIG. 23, discussed below), supporting circuitry to route electrical signals to the transistors, passive components (e.g., traces, resistors, capacitors, inductors, and/or other circuitry), and/or any other components. In some examples, the die 2202 may include and/or implement a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuitry. Multiple ones of these devices may be combined on a single die 2202. For example, a memory array formed by multiple memory circuits may be formed on a same die 2202 as programmable circuitry (e.g., the processor circuitry 2502 of FIG. 25) or other logic circuitry. Such memory may store information for use by the programmable circuitry.

Figure 23:
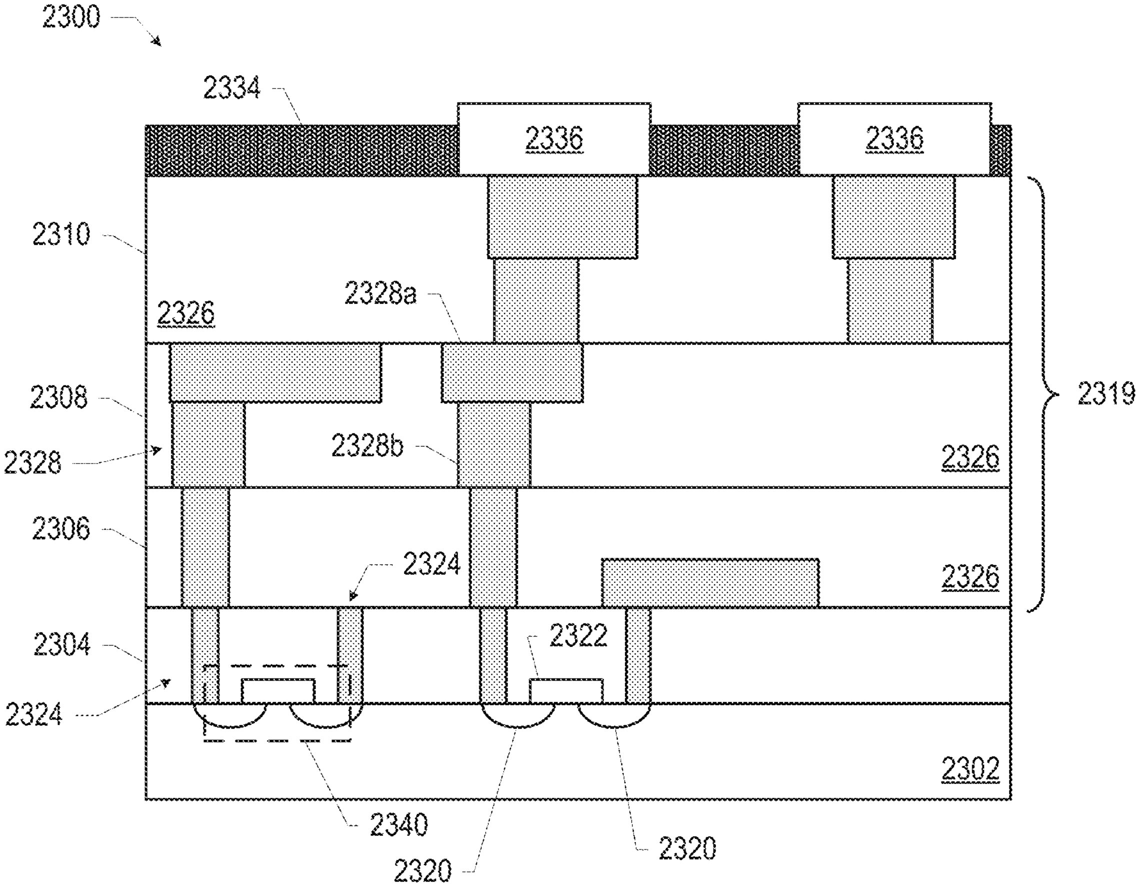
FIG. 23 is a cross-sectional side view of an IC device that may be included in an IC package constructed in accordance with teachings disclosed herein.

FIG. 23 is a cross-sectional side view of an IC device 2300 that may be included in the example IC package 100 (e.g., in any one of the dies 106, 108) that contains any one of the example glass core assemblies 300, 900, 1902. One or more of the IC devices 2300 may be included in one or more dies 2202 (FIG. 22). The IC device 2300 may be formed on a die substrate 2302 (e.g., the wafer 2200 of FIG. 22) and may be included in a die (e.g., the die 2202 of FIG. 22). The die substrate 2302 may be a semiconductor substrate composed of semiconductor material systems including, for example, n-type or p-type materials systems (or a combination of both). The die substrate 2302 may include, for example, a crystalline substrate formed using a bulk silicon or a silicon-on-insulator (SOI) substructure. In some examples, the die substrate 2302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 2302. Although a few examples of materials from which the die substrate 2302 may be formed are described here, any material that may serve as a foundation for an IC device 2300 may be used. The die substrate 2302 may be part of a singulated die (e.g., the dies 2202 of FIG. 22) or a wafer (e.g., the wafer 2200 of FIG. 22).

The IC device 2300 may include one or more device layers 2304 disposed on or above the die substrate 2302. The device layer 2304 may include features of one or more transistors 2340 (e.g., metal oxide semiconductor field-effect transistors (MOSFETs)) formed on the die substrate 2302. The device layer 2304 may include, for example, one or more source and/or drain (S/D) regions 2320, a gate 2322 to control current flow between the S/D regions 2320, and one or more S/D contacts 2324 to route electrical signals to/from the S/D regions 2320. The transistors 2340 may include additional features not depicted for the sake of clarity, such as device isolation regions, gate contacts, and the like. The transistors 2340 are not limited to the type and configuration depicted in FIG. 23 and may include a wide variety of other types and/or configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2340 may include a gate 2322 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2340 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2340 along the source-channel-drain direction, the gate electrode may consist of a U-shaped structure that includes a bottom portion substantially parallel to the surface of the die substrate 2302 and two sidewall portions that are substantially perpendicular to the top surface of the die substrate 2302. In other examples, at least one of the metal layers that form the gate electrode may simply be a planar layer that is substantially parallel to the top surface of the die substrate 2302 and does not include sidewall portions substantially perpendicular to the top surface of the die substrate 2302. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2320 may be formed within the die substrate 2302 adjacent to the gate 2322 of each transistor 2340. The S/D regions 2320 may be formed using an implantation/diffusion process or an etching/deposition process, for example. In the former process, dopants such as boron, aluminum, antimony, phosphorous, or arsenic may be ion-implanted into the die substrate 2302 to form the S/D regions 2320. An annealing process that activates the dopants and causes them to diffuse farther into the die substrate 2302 may follow the ion-implantation process. In the latter process, the die substrate 2302 may first be etched to form recesses at the locations of the S/D regions 2320. An epitaxial deposition process may then be carried out to fill the recesses with material that is used to fabricate the S/D regions 2320. In some implementations, the S/D regions 2320 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2320 may be formed using one or more alternate semiconductor materials such as germanium or a group III-V material or alloy. In further examples, one or more layers of metal and/or metal alloys may be used to form the S/D regions 2320.

Electrical signals, such as power and/or input/output (I/O) signals, may be routed to and/or from the devices (e.g., transistors 2340) of the device layer 2304 through one or more interconnect layers disposed on the device layer 2304 (illustrated in FIG. 23 as interconnect layers 2306-2310). For example, electrically conductive features of the device layer 2304 (e.g., the gate 2322 and the S/D contacts 2324) may be electrically coupled with the interconnect structures 2328 of the interconnect layers 2306-2310. The one or more interconnect layers 2306-2310 may form a metallization stack (also referred to as an "ILD stack") 2319 of the IC device 2300.

The interconnect structures 2328 may be arranged within the interconnect layers 2306-2310 to route electrical signals according to a wide variety of designs (in particular, the arrangement is not limited to the particular configuration of interconnect structures 2328 depicted in FIG. 23). Although a particular number of interconnect layers 2306-2310 is depicted in FIG. 23, examples of the present disclosure include IC devices having more or fewer interconnect layers than depicted.

In some examples, the interconnect structures 2328 may include lines **2328*a* and/or vias 2328*b* filled with an electrically conductive material such as a metal. The lines 2328*a* may be arranged to route electrical signals in a direction of a plane that is substantially parallel with a surface of the die substrate 2302 upon which the device layer 2304 is formed. For example, the lines 2328*a* may route electrical signals in a direction in and out of the page from the perspective of FIG. 23. The vias 2328*b* may be arranged to route electrical signals in a direction of a plane that is substantially perpendicular to the surface of the die substrate 2302 upon which the device layer 2304 is formed. In some examples, the vias 2328*b* may electrically couple lines 2328*a* of different interconnect layers 2306-2310** together.

The interconnect layers 2306-2310 may include a dielectric material 2326 disposed between the interconnect structures 2328, as shown in FIG. 23. In some examples, the dielectric material 2326 disposed between the interconnect structures 2328 in different ones of the interconnect layers 2306-2310 may have different compositions; in other examples, the composition of the dielectric material 2326 between different interconnect layers 2306-2310 may be the same.

A first interconnect layer 2306 (referred to as Metal 1 or "M1") may be formed directly on the device layer 2304. In some examples, the first interconnect layer 2306 may include lines 2328*a* and/or vias 2328*b*, as shown. The lines 2328*a* of the first interconnect layer 2306 may be coupled with contacts (e.g., the S/D contacts 2324) of the device layer 2304.

A second interconnect layer 2308 (referred to as Metal 2 or "M2") may be formed directly on the first interconnect layer 2306. In some examples, the second interconnect layer 2308 may include vias 2328*b* to couple the lines 2328*a* of the second interconnect layer 2308 with the lines 2328*a* of the first interconnect layer 2306. Although the lines 2328*a* and the vias 2328*b* are structurally delineated with a line within each interconnect layer (e.g., within the second interconnect layer 2308) for the sake of clarity, the lines 2328*a* and the vias 2328*b* may be structurally and/or materially contiguous (e.g., simultaneously filled during a dual-damascene process) in some examples.

A third interconnect layer 2310 (referred to as Metal 3 or "M3") (and additional interconnect layers, as desired) may be formed in succession on the second interconnect layer 2308 according to similar techniques and configurations described in connection with the second interconnect layer 2308 or the first interconnect layer 2306. In some examples, the interconnect layers that are "higher up" in the metallization stack 2319 in the IC device 2300 (i.e., further away from the device layer 2304) may be thicker.

The IC device 2300 may include a solder resist material 2334 (e.g., polyimide or similar material) and one or more conductive contacts 2336 formed on the interconnect layers 2306-2310. In FIG. 23, the conductive contacts 2336 are illustrated as taking the form of bond pads. The conductive contacts 2336 may be electrically coupled with the interconnect structures 2328 and configured to route the electrical signals of the transistor(s) 2340 to other external devices. For example, solder bonds may be formed on the one or more conductive contacts 2336 to mechanically and/or electrically couple a chip including the IC device 2300 with another component (e.g., a circuit board). The IC device 2300 may include additional or alternate structures to route the electrical signals from the interconnect layers 2306-2310; for example, the conductive contacts 2336 may include other analogous features (e.g., posts) that route the electrical signals to external components.

Figure 24:
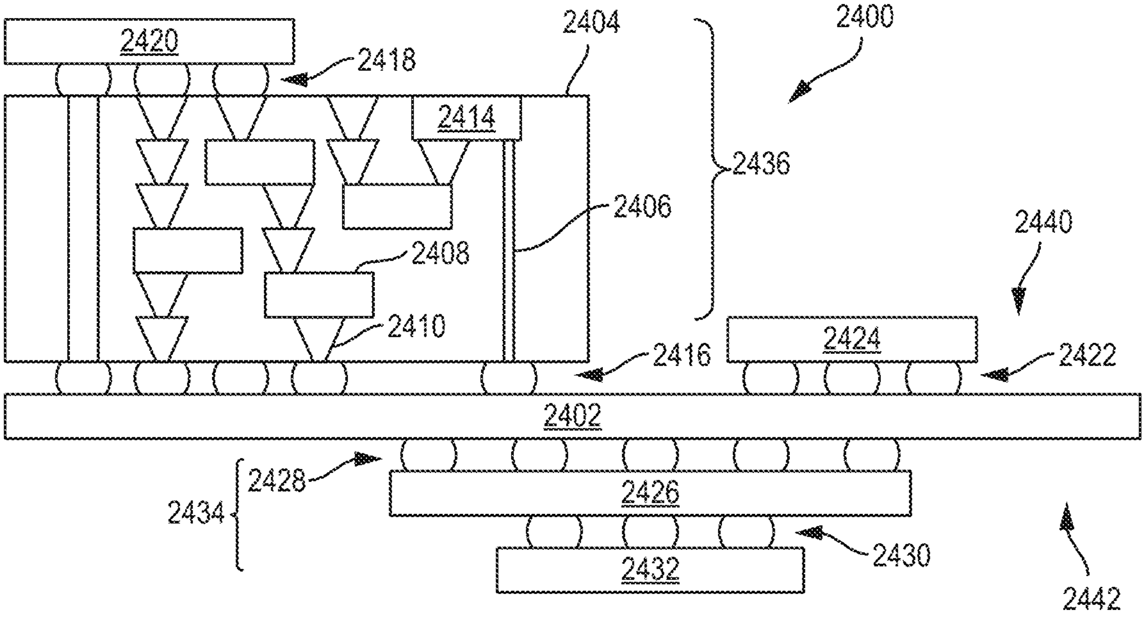
FIG. 24 is a cross-sectional side view of an IC device assembly that may include an IC package constructed in accordance with teachings disclosed herein.

FIG. 24 is a cross-sectional side view of an IC device assembly 2400 that may include the IC package 100 disclosed herein. In some examples, the IC device assembly corresponds to the IC package 100, which may include any one of the example glass core assemblies 300, 900, 1902. The IC device assembly 2400 includes a number of components disposed on a circuit board 2402 (which may be, for example, a motherboard). The IC device assembly 2400 includes components disposed on a first face 2440 of the circuit board 2402 and an opposing second face 2442 of the circuit board 2402; generally, components may be disposed on one or both faces 2440 and 2442. Any of the IC packages discussed below with reference to the IC device assembly 2400 may take the form of the example IC package 100 of FIG. 1.

In some examples, the circuit board 2402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2402. In other examples, the circuit board 2402 may be a non-PCB substrate. In some examples, the circuit board 2402 may be, for example, the circuit board 102 of FIG. 1.

The IC device assembly 2400 illustrated in FIG. 24 includes a package-on-interposer structure 2436 coupled to the first face 2440 of the circuit board 2402 by coupling components 2416. The coupling components 2416 may electrically and mechanically couple the package-on-interposer structure 2436 to the circuit board 2402, and may include solder balls (as shown in FIG. 24), male and female portions of a socket, an adhesive, an underfill material, and/or any other suitable electrical and/or mechanical coupling structure.

The package-on-interposer structure 2436 may include an IC package 2420 coupled to an interposer 2404 by coupling components 2418. The coupling components 2418 may take any suitable form for the application, such as the forms discussed above with reference to the coupling components 2416. Although a single IC package 2420 is shown in FIG. 24, multiple IC packages may be coupled to the interposer 2404; indeed, additional interposers may be coupled to the interposer 2404. The interposer 2404 may provide an intervening substrate used to bridge the circuit board 2402 and the IC package 2420. The IC package 2420 may be or include, for example, a die (the die 2202 of FIG. 22), an IC device (e.g., the IC device 2300 of FIG. 23), or any other suitable component. Generally, the interposer 2404 may spread a connection to a wider pitch or reroute a connection to a different connection. For example, the interposer 2404 may couple the IC package 2420 (e.g., a die) to a set of BGA conductive contacts of the coupling components 2416 for coupling to the circuit board 2402. In the example illustrated in FIG. 24, the IC package 2420 and the circuit board 2402 are attached to opposing sides of the interposer 2404; in other examples, the IC package 2420 and the circuit board 2402 may be attached to a same side of the interposer 2404. In some examples, three or more components may be interconnected by way of the interposer 2404.

In some examples, the interposer 1704 may be formed as a PCB, including multiple metal layers separated from one another by layers of dielectric material and interconnected by electrically conductive vias. In some examples, the interposer 1704 may be formed of an epoxy resin, a fiberglass-reinforced epoxy resin, an epoxy resin with inorganic fillers, a ceramic material, or a polymer material such as polyimide. In some examples, the interposer 2404 may be formed of alternate rigid or flexible materials that may include the same materials described above for use in a semiconductor substrate, such as silicon, germanium, and other group III-V and group IV materials. The interposer 2404 may include metal interconnects 2408 and vias 2410, including but not limited to through-silicon vias (TSVs) 2406. The interposer 2404 may further include embedded devices 2414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2404. The package-on-interposer structure 2436 may take the form of any of the package-on-interposer structures known in the art.

The IC device assembly 2400 may include an IC package 2424 coupled to the first face 2440 of the circuit board 2402 by coupling components 2422. The coupling components 2422 may take the form of any of the examples discussed above with reference to the coupling components 2416, and the IC package 2424 may take the form of any of the examples discussed above with reference to the IC package 2420.

The IC device assembly 2400 illustrated in FIG. 24 includes a package-on-package structure 2434 coupled to the second face 2442 of the circuit board 2402 by coupling components 2428. The package-on-package structure 2434 may include a first IC package 2426 and a second IC package 2432 coupled together by coupling components 2430 such that the first IC package 2426 is disposed between the circuit board 2402 and the second IC package 2432. The coupling components 2428, 2430 may take the form of any of the examples of the coupling components 2416 discussed above, and the IC packages 2426, 2432 may take the form of any of the examples of the IC package 2420 discussed above. The package-on-package structure 2434 may be configured in accordance with any of the package-on-package structures known in the art.

Figure 25:
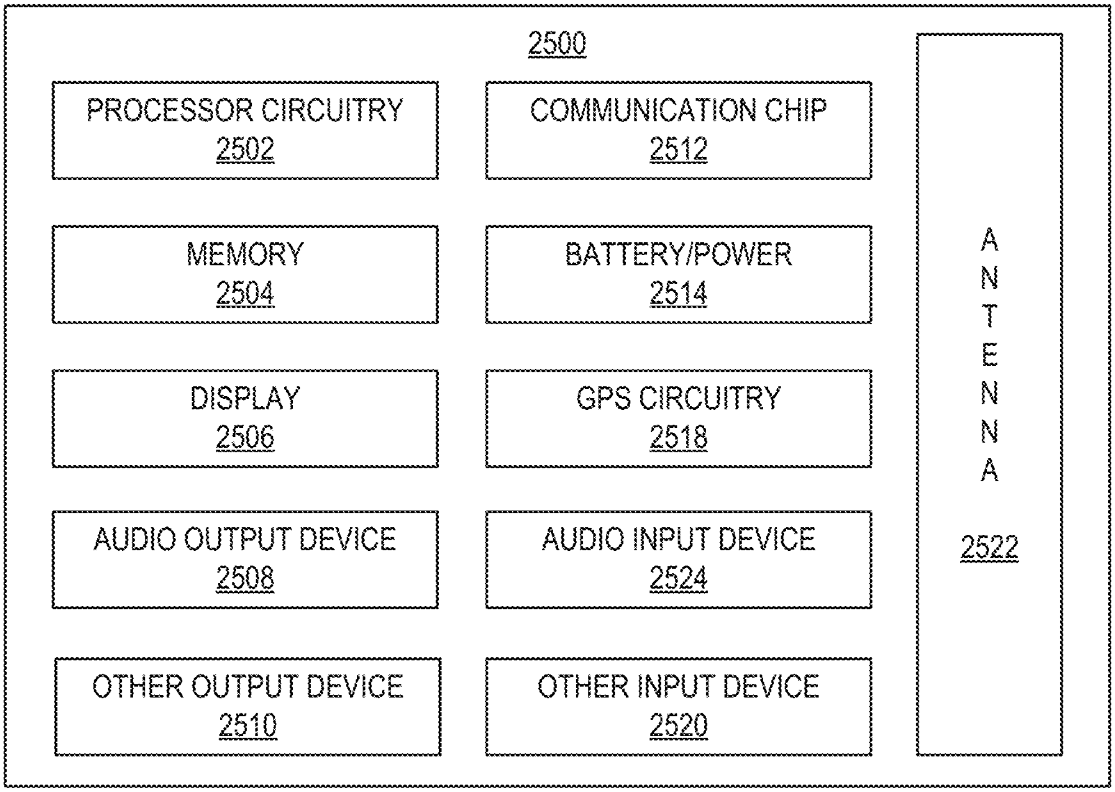
FIG. 25 is a block diagram of an example electrical device that may include an IC package constructed in accordance with teachings disclosed herein.

FIG. 25 is a block diagram of an example electrical device 2500 that may include one or more of the example IC packages 100 of FIG. 1 that contains one or more of the example glass core assemblies 300, 900, 1902. For example, any suitable ones of the components of the electrical device 2500 may include one or more of the device assemblies 2400, IC devices 2300, or dies 2202 disclosed herein, and may be arranged in the example IC package 100. A number of components are illustrated in FIG. 25 as included in the electrical device 2500, but any one or more of these components may be omitted or duplicated, as suitable for the application. In some examples, some or all of the components included in the electrical device 2500 may be attached to one or more motherboards. In some examples, some or all of these components are fabricated onto a single system-on-a-chip (SoC) die.

Additionally, in various examples, the electrical device 2500 may not include one or more of the components illustrated in FIG. 25, but the electrical device 2500 may include interface circuitry for coupling to the one or more components. For example, the electrical device 2500 may not include a display 2506, but may include display interface circuitry (e.g., a connector and driver circuitry) to which a display 2506 may be coupled. In another set of examples, the electrical device 2500 may not include an audio input device 2524 (e.g., microphone) or an audio output device 2508 (e.g., a speaker, a headset, earbuds, etc.), but may include audio input or output device interface circuitry (e.g., connectors and supporting circuitry) to which an audio input device 2524 or audio output device 2508 may be coupled.

The electrical device 2500 may include programmable circuitry 2502 (e.g., one or more processing devices). The programmable circuitry 2502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2500 may include a memory 2504, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2504 may include memory that shares a die with the programmable circuitry 2502. This memory may be used as cache memory and may include embedded dynamic random access memory (eDRAM) or spin transfer torque magnetic random access memory (STT-MRAM).

In some examples, the electrical device 2500 may include a communication chip 2512 (e.g., one or more communication chips). For example, the communication chip 2512 may be configured for managing wireless communications for the transfer of data to and from the electrical device 2500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2512 may operate in accordance with other wireless protocols in other examples. The electrical device 2500 may include an antenna 2522 to facilitate wireless communications and/or to receive other wireless communications (such as AM or FM radio transmissions).

In some examples, the communication chip 2512 may manage wired communications, such as electrical, optical, or any other suitable communication protocols (e.g., the Ethernet). As noted above, the communication chip 2512 may include multiple communication chips. For instance, a first communication chip 2512 may be dedicated to shorter-range wireless communications such as Wi-Fi or Bluetooth, and a second communication chip 2512 may be dedicated to longer-range wireless communications such as global positioning system (GPS), EDGE, GPRS, CDMA, WiMAX, LTE, EV-DO, or others. In some examples, a first communication chip 2512 may be dedicated to wireless communications, and a second communication chip 2512 may be dedicated to wired communications.

The electrical device 2500 may include battery/power circuitry 2514. The battery/power circuitry 2514 may include one or more energy storage devices (e.g., batteries or capacitors) and/or circuitry for coupling components of the electrical device 2500 to an energy source separate from the electrical device 2500 (e.g., AC line power).

The electrical device 2500 may include a display 2506 (or corresponding interface circuitry, as discussed above). The display 2506 may include any visual indicators, such as a heads-up display, a computer monitor, a projector, a touchscreen display, a liquid crystal display (LCD), a light-emitting diode display, or a flat panel display.

The electrical device 2500 may include an audio output device 2508 (or corresponding interface circuitry, as discussed above). The audio output device 2508 may include any device that generates an audible indicator, such as speakers, headsets, or earbuds.

The electrical device 2500 may include an audio input device 2524 (or corresponding interface circuitry, as discussed above). The audio input device 2524 may include any device that generates a signal representative of a sound, such as microphones, microphone arrays, or digital instruments (e.g., instruments having a musical instrument digital interface (MIDI) output).

The electrical device 2500 may include GPS circuity 2518. The GPS circuity 2518 may be in communication with a satellite-based system and may receive a location of the electrical device 2500, as known in the art.

The electrical device 2500 may include any other output device 2510 (or corresponding interface circuitry, as discussed above). Examples of the other output device 2510 may include an audio codec, a video codec, a printer, a wired or wireless transmitter for providing information to other devices, or an additional storage device.

The electrical device 2500 may include any other input device 2520 (or corresponding interface circuitry, as discussed above). Examples of the other input device 2520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2500 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2500 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that produce a glass core assembly with fewer number of deposition processes and fewer number of lithography operations than known approaches by depositing a reflective metal on the surface of a cavity in a glass core and on other surfaces of the glass core associated with metal interconnects (e.g., through glass vias and associated conductive pads) in a single deposition process. The reflective metal in the cavity serves the purpose of a reflective surface (e.g., a mirror) for an optical component and the reflective metal on the other surfaces serves the purpose of a seed metal for the subsequent deposition of a conductive material (e.g., copper) for the metal interconnects. Reducing the process operations needed manufacture the glass core assemblies, in effect, reduces the amount of defects in the glass core assemblies. Disclosed are apparatus and methods of manufacturing that save time and cost of producing the glass core assemblies described herein. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture to photonic integrated circuit packages are disclosed herein. Further examples and combinations thereof include the following:

Example 1 includes an integrated circuit (IC) package comprising a semiconductor die, a package substrate supporting the semiconductor die, the package substrate including a glass core, the glass core including a through glass via extending between opposing first and second surfaces of the glass core, the glass core including a recess spaced apart from the through glass via, the recess defined by a third surface of the glass core, the recess having a different shape than the through glass via, and a reflective metal disposed on the third surface to define a mirror, the reflective metal also disposed between a wall of the through glass via and a conductive material disposed in the through glass via.

Example 2 includes the apparatus as defined in example 1, wherein the third surface is a non-planar surface.

Example 3 includes the apparatus as defined in example 1, wherein the reflective metal on the third surface is a first thickness and the reflective metal on the wall of the through glass via is a second thickness, the first thickness approximately equal to the second thickness.

Example 4 includes the apparatus as defined in example 1, wherein the third surface is angled relative to the wall of the through glass via and angled relative to the first and second surfaces of the glass core.

Example 5 includes the apparatus as defined in example 1, wherein the third surface is arcuate.

Example 6 includes the apparatus as defined in example 1, wherein the reflective metal on the wall of the through glass via extends a full length of the through glass via between the first and second surfaces of the glass core.

Example 7 includes the apparatus as defined in example 1, wherein the reflective metal on the wall of the through glass via extends a partial length of the through glass via between the first and second surfaces of the glass core.

Example 8 includes the apparatus of example 7, wherein the partial length of the through glass via including the reflective metal is at a first end of the via adjacent the first surface of the glass core, the recess in the first surface of the glass core.

Example 9 includes the apparatus of example 7, wherein the partial length of the through glass via including the reflective metal is at a first end of the via adjacent the first surface of the glass core, the recess in the second surface of the glass core.

Example 10 includes the apparatus of example 1, wherein the conductive material defines a pad on the first surface of the glass core, the recess in the first surface of the glass core, the pad electrically coupled to the conductive material in the through glass via, the reflective metal disposed between the pad and the first surface of the glass core.

Example 11 includes the apparatus as defined in example 1, wherein the reflective metal includes aluminum.

Example 12 includes the apparatus as defined in example 1, wherein the reflective metal includes gold.

Example 13 includes the apparatus as defined in example 1, wherein the reflective metal includes silver.

Example 14 includes the apparatus as defined in claim 1, wherein the reflective metal includes ruthenium.

Example 15 includes the apparatus as defined in example 1, wherein the reflective metal is in direct contact with the third surface and in direct contact with the wall of the through glass via.

Example 16 includes an integrated circuit (IC) package comprising a package substrate, a semiconductor die mounted on the package substrate, and a glass core within the package substrate, the glass core including a through glass via extending through the glass core, the glass core including a void spaced apart from the through glass via, the void having a different shape than the through glass via, surfaces of both the through glass via and the void lined by a common reflective metal, the reflective metal to reflect light that is to pass through the glass core.

Example 17 includes the apparatus as defined in example 16, wherein the void surface is a multidimensional surface.

Example 18 includes the apparatus as defined in example 16 wherein the reflective metal on the void surface has a first depth and the reflective metal on the through glass via surface is a second depth, the first depth consistent with the second depth.

Example 19 includes the apparatus as defined in example 16, wherein the glass core has an opposing first and second side and the void surface is slanted relative to the first side and the second side of the glass core.

Example 20 includes the apparatus as defined in example 16, wherein the void surface is curved.

Example 21 includes the apparatus as defined in example 16, wherein the reflective metal covers a full length of the surface of the through glass via from a first side of the glass core to a second side of the glass core.

Example 22 includes the apparatus as defined in example 16, wherein the reflective metal on the surface of the through glass via extends a partial length of the through glass via from a first side of the glass core to a second side of the glass core.

Example 23 includes the apparatus of example 22, wherein the partial length of the through glass via including the reflective metal is at a first end of the via adjacent a first side of the glass core, the void in the first side of the glass core.

Example 24 includes the apparatus of example 22, wherein the partial length of the through glass via including the reflective metal is at a first end of the via adjacent a first side of the glass core, the recess in a second side of the glass core.

Example 25 includes the apparatus of example 16, wherein the reflective metal is deposed a first and second partial length on the first surface and a third and fourth the second surface adjacent a first end and a second end of the via, respectively, and a conductive material is deposed on the first and second partial length and the third and fourth partial length to define a first contact and a second contact.

Example 26 includes the apparatus as defined in example 16, wherein the reflective metal includes at least one of aluminum, gold, or silver.

Example 27 includes a method of manufacturing an integrated circuit package, the method comprising providing a through glass via in a glass core, providing a recess in the glass core spaced apart from the through glass via, and depositing a metal film on surfaces of both the through glass via and the recess at a same point in time.

Example 28 includes the method of example 27, includes depositing a conductive material on the glass core using the metal film as a seed.

Example 29 includes the method as defined in example 28, includes removing portions of at least one of the metal film or the conductive metal from the glass core.

Example 30 includes the method as defined in example 27, wherein the depositing of the metal film involves at least one of atomic layer deposition or physical vapor deposition.

Example 31 includes the method as defined in example 27, wherein the depositing of the metal film involves physical vapor deposition.

Example 32 includes the method as defined in example 27, wherein the depositing of the metal film involves a conformal coating process so that a thickness of the metal film is substantially consistent across the surfaces of both the through glass via and the recess.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An integrated circuit (IC) package comprising:

a semiconductor die;

a package substrate supporting the semiconductor die, the package substrate including a glass core, the glass core including a through glass via extending between opposing first and second surfaces of the glass core, the glass core including a recess spaced apart from the through glass via, the recess defined by a third surface of the glass core, the recess having a different shape than the through glass via; and a reflective metal disposed on the third surface to define a mirror, the reflective metal also disposed between a wall of the through glass via and a conductive material disposed in the through glass via.

2. The IC package as defined in claim 1, wherein the third surface is a non-planar surface.

3. The IC package as defined in claim 1, wherein the reflective metal on the third surface is a first thickness and the reflective metal on the wall of the through glass via is a second thickness, the first thickness approximately equal to the second thickness.

4. The IC package as defined in claim 1, wherein the third surface is angled relative to the wall of the through glass via and angled relative to the first and second surfaces of the glass core.

5. The IC package as defined in claim 1, wherein the reflective metal on the wall of the through glass via extends a full length of the through glass via between the first and second surfaces of the glass core.

6. The IC package as defined in claim 1, wherein the reflective metal on the wall of the through glass via extends a partial length of the through glass via between the first and second surfaces of the glass core.

7. The IC package of claim 6, wherein the partial length of the through glass via including the reflective metal is at a first end of the through glass via adjacent the first surface of the glass core, the recess in the first surface of the glass core.

8. The IC package of claim 1, wherein the conductive material defines a pad on the first surface of the glass core, the recess in the first surface of the glass core, the pad electrically coupled to the conductive material in the through glass via, the reflective metal disposed between the pad and the first surface of the glass core.

9. The IC package as defined in claim 1, wherein the reflective metal includes ruthenium.

10. The IC package as defined in claim 1, wherein the reflective metal includes aluminum.

11. The IC package as defined in claim 1, wherein the reflective metal includes gold.

12. The IC package as defined in claim 1, wherein the reflective metal includes silver.

13. The IC package as defined in claim 1, wherein the reflective metal is in direct contact with the third surface and in direct contact with the wall of the through glass via.

14. An integrated circuit (IC) package comprising:

a package substrate;

a semiconductor die mounted on the package substrate; and a glass core within the package substrate, the glass core including a through glass via extending through the glass core, the glass core including a void spaced apart from the through glass via, the void having a different shape than the through glass via, surfaces of both the through glass via and the void lined by a common reflective metal, the reflective metal to reflect light that is to pass through the glass core.

15. The IC package as defined in claim 14, wherein the reflective metal on the void surface has a first depth and the reflective metal on the through glass via surface is a second depth, the first depth consistent with the second depth.

16. The IC package as defined in claim 14, wherein the void surface is curved.

17. A method of manufacturing an integrated circuit package, the method comprising:

providing a through glass via in a glass core;

providing a recess in the glass core spaced apart from the through glass via; and depositing a metal film on surfaces of both the through glass via and the recess at a same point in time.

18. The method of claim 17, includes depositing a conductive material on the glass core using the metal film as a seed.

19. The method as defined in claim 17, wherein the depositing of the metal film involves at least one of atomic layer deposition or physical vapor deposition.

20. The method as defined in claim 17, wherein the depositing of the metal film involves a conformal coating process so that a thickness of the metal film is substantially consistent across the surfaces of both the through glass via and the recess.

* * * * *